US012600618B2

(12) United States Patent
Jiang et al.

(10) Patent No.: US 12,600,618 B2
(45) Date of Patent: Apr. 14, 2026

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Jheng-Hong Jiang, Hsinchu (TW); Shing-Huang Wu, Hsinchu City (TW); Chia-Wei Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 719 days.

(21) Appl. No.: 17/818,347

(22) Filed: Aug. 8, 2022

(65) Prior Publication Data

US 2024/0043262 A1 Feb. 8, 2024

(51) Int. Cl.
*B81B 3/00* (2006.01)

(52) U.S. Cl.
CPC .... *B81B 3/0021* (2013.01); *B81B 2201/0242* (2013.01); *B81B 2203/0136* (2013.01)

(58) Field of Classification Search
CPC .......... B81B 3/0021; B81B 2201/0242; B81B 2203/0136; B81B 3/007
See application file for complete search history.

(56) References Cited

U.S. PATENT DOCUMENTS

| | | | |
|---|---|---|---|
| 2015/0251895 A1* | 9/2015 | Chu .................... | B81C 1/00238 257/595 |
| 2016/0097792 A1* | 4/2016 | Naumann ............... | G01P 15/18 73/504.02 |
| 2016/0229692 A1* | 8/2016 | Lin .................... | B81C 1/00238 |
| 2017/0142525 A1* | 5/2017 | Glacer et al. ....... | B81C 1/00158 |
| 2022/0396470 A1* | 12/2022 | Leahy et al. .......... | B81B 3/0021 |

* cited by examiner

*Primary Examiner* — Christine S. Kim
*Assistant Examiner* — Nathalie R Fayette
(74) *Attorney, Agent, or Firm* — WPAT LAW; Anthony King

(57) ABSTRACT

A semiconductor structure is provided. The semiconductor structure includes a substrate; a fixed structure, disposed on the substrate; a floating structure, connected to the fixed structure and separated from the substrate, wherein a first surface of the floating structure facing the substrate includes a plurality of recesses; and a capping layer, disposed on the first surface of the floating structure, wherein the capping layer exposes a portion of the floating structure.

20 Claims, 33 Drawing Sheets

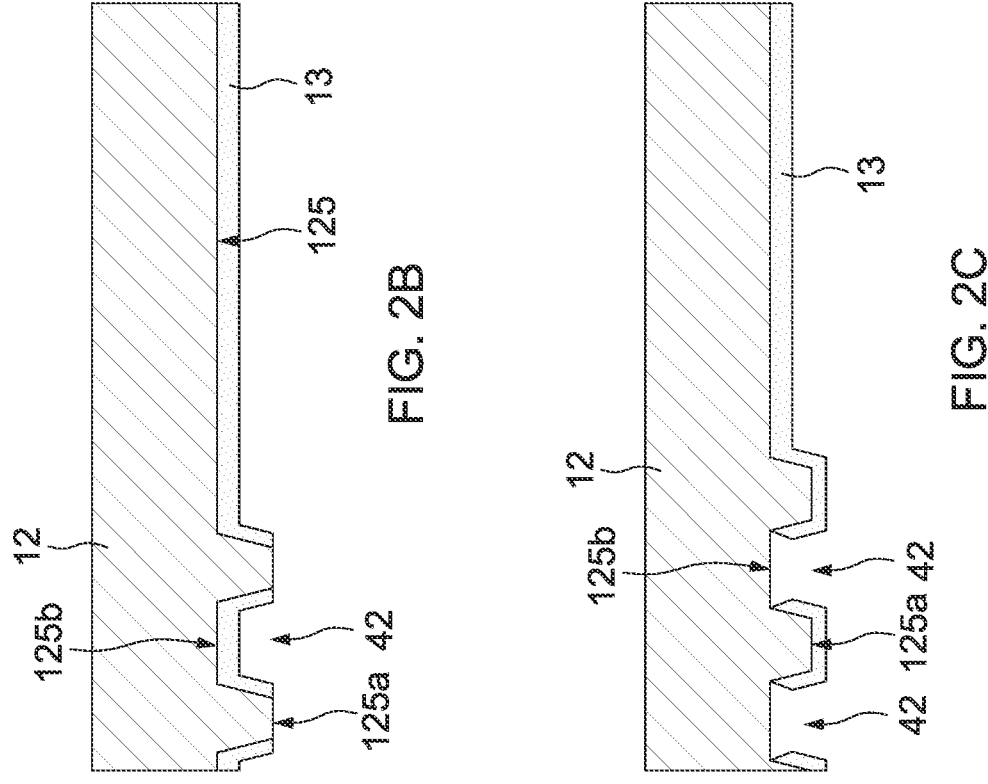
FIG. 2B
FIG. 2C
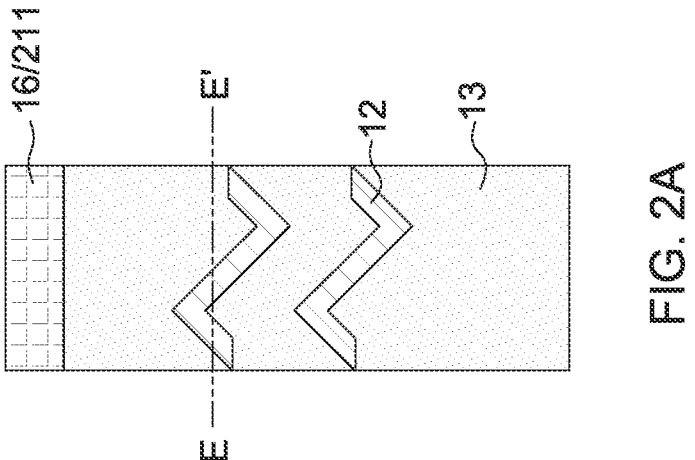
FIG. 2A

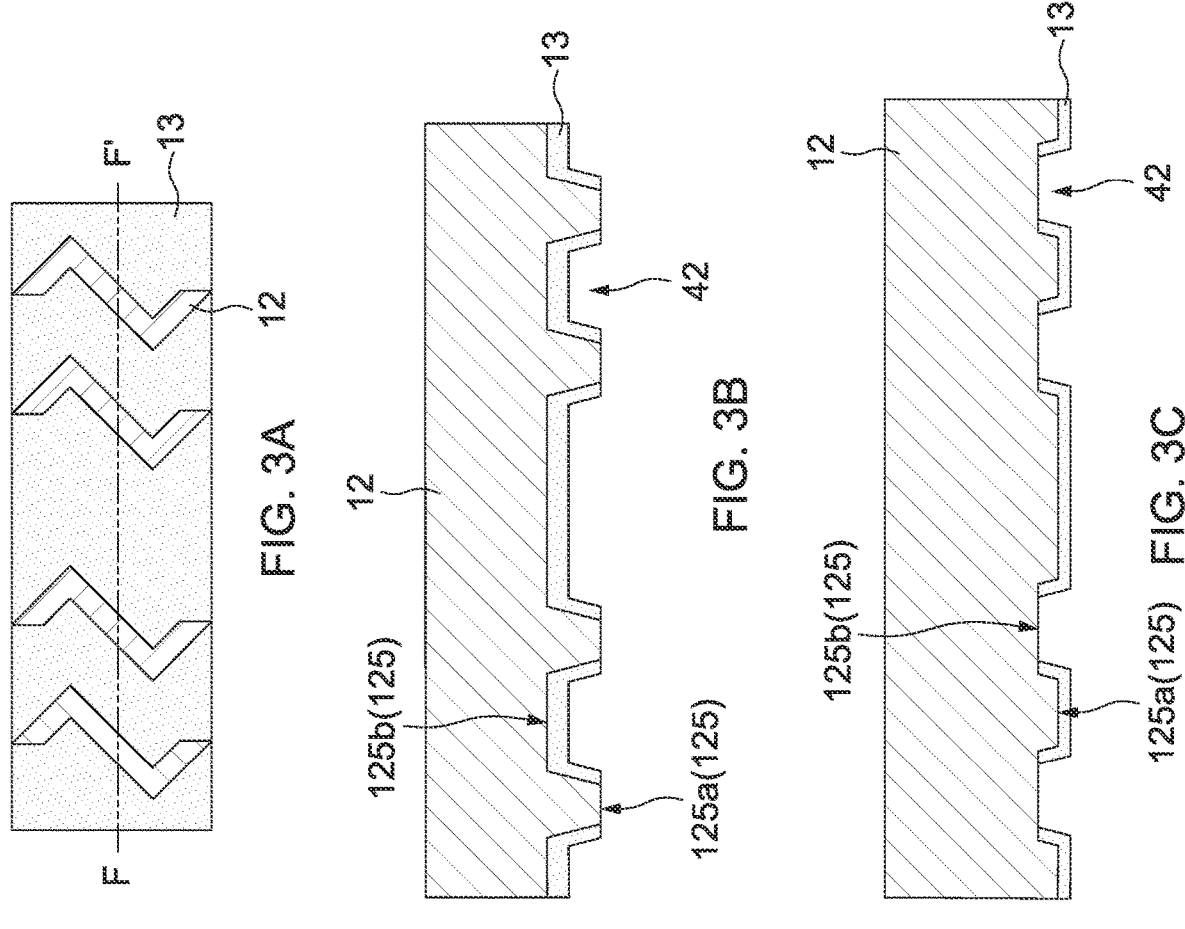

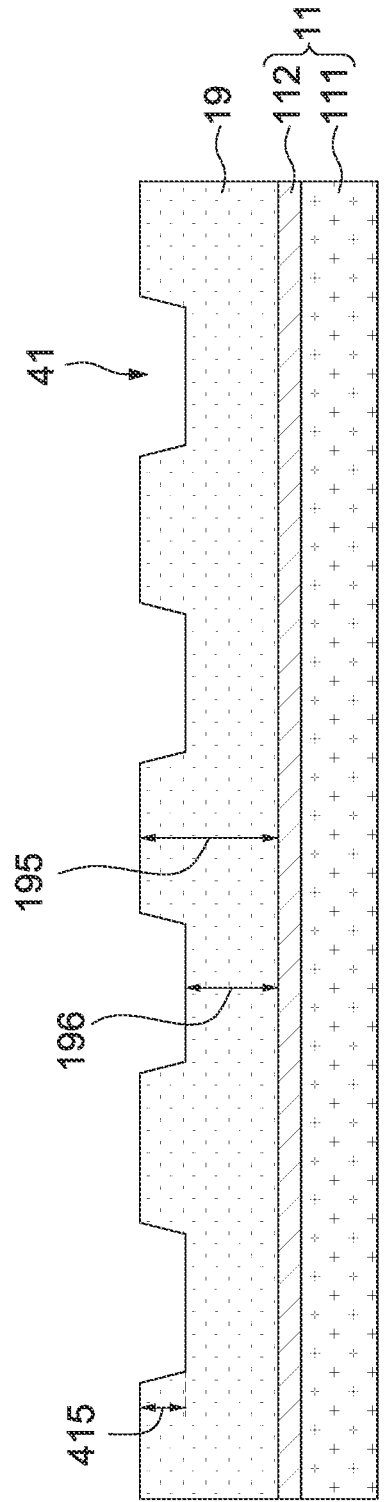
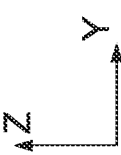
FIG. 4

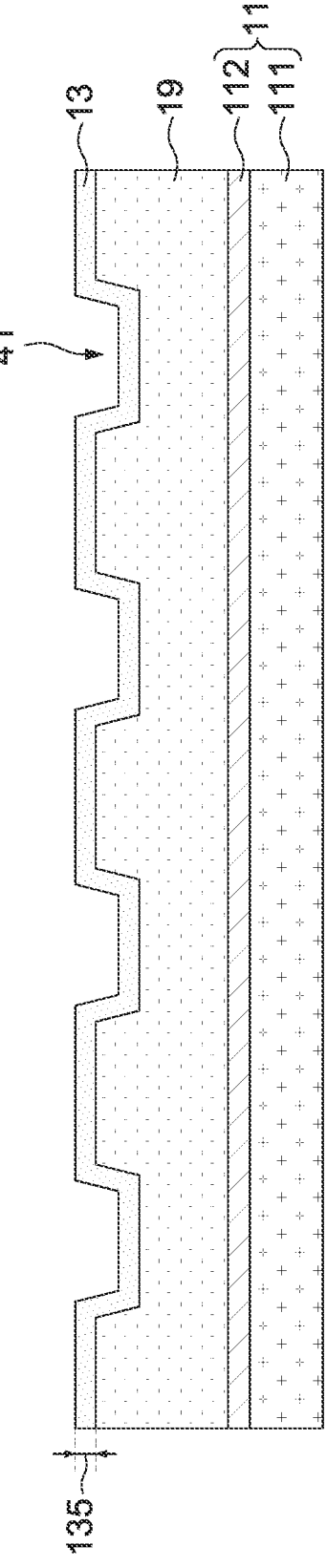
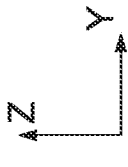
FIG. 5

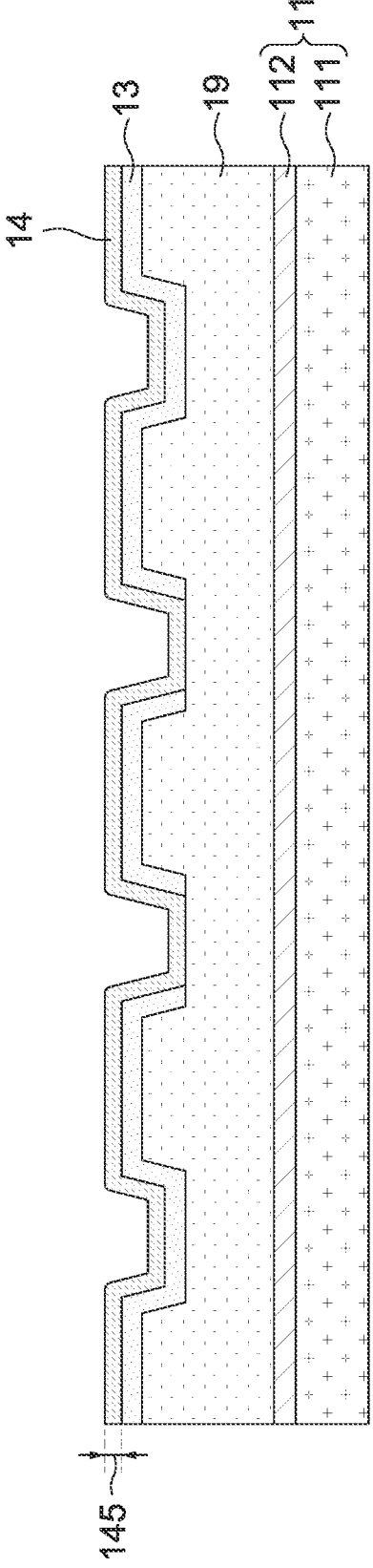
FIG. 7

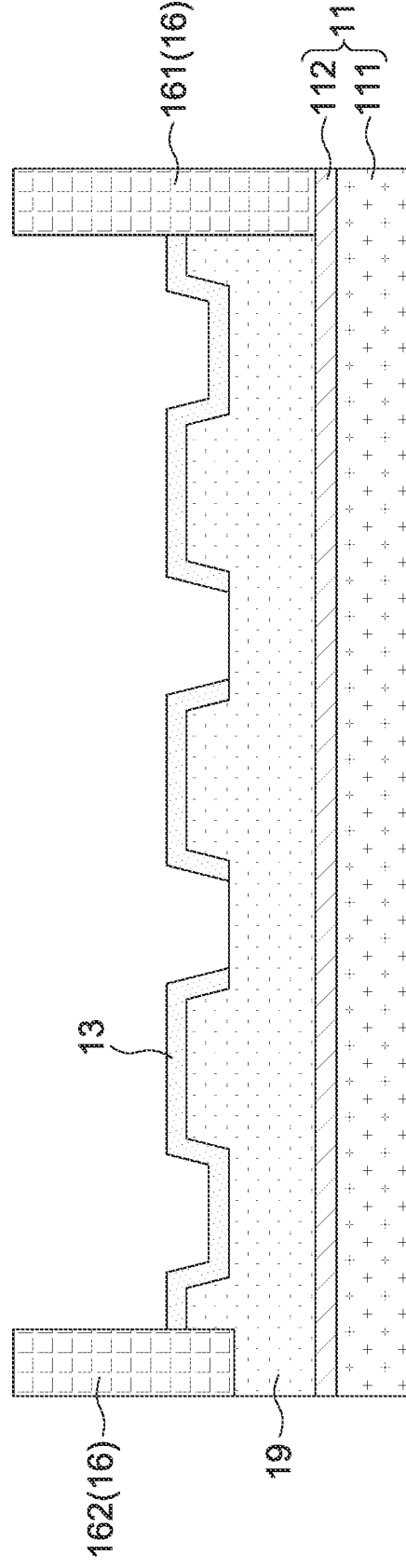
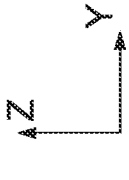
FIG. 8

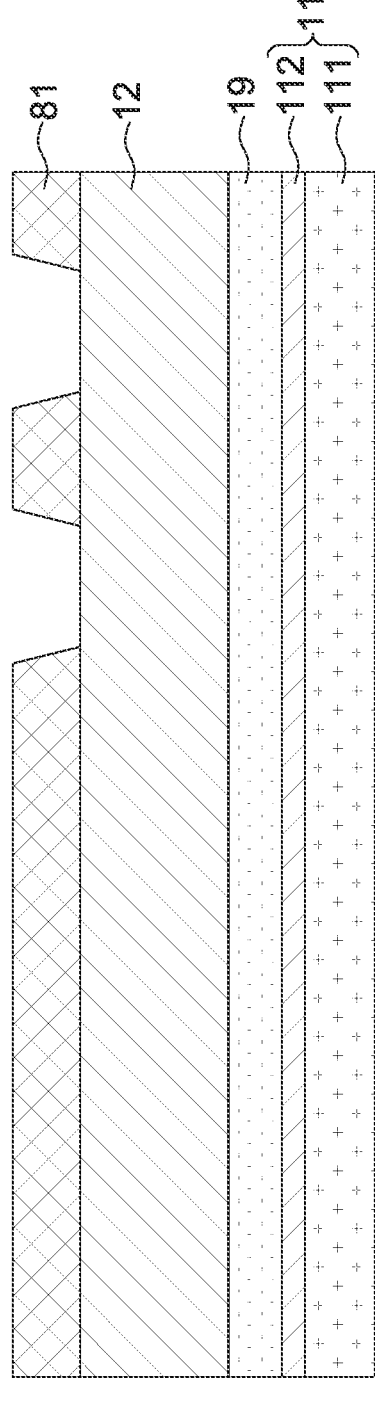
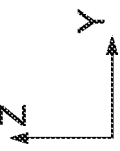
FIG. 12

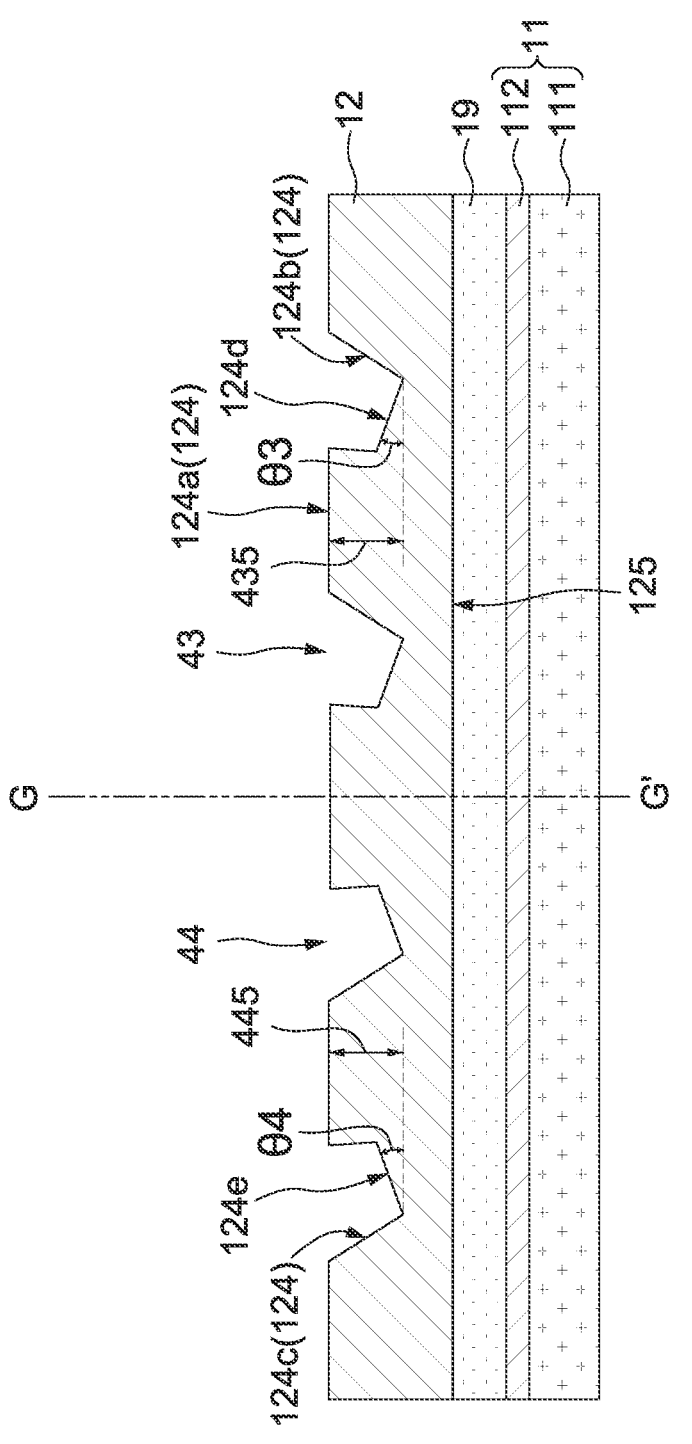
FIG. 15

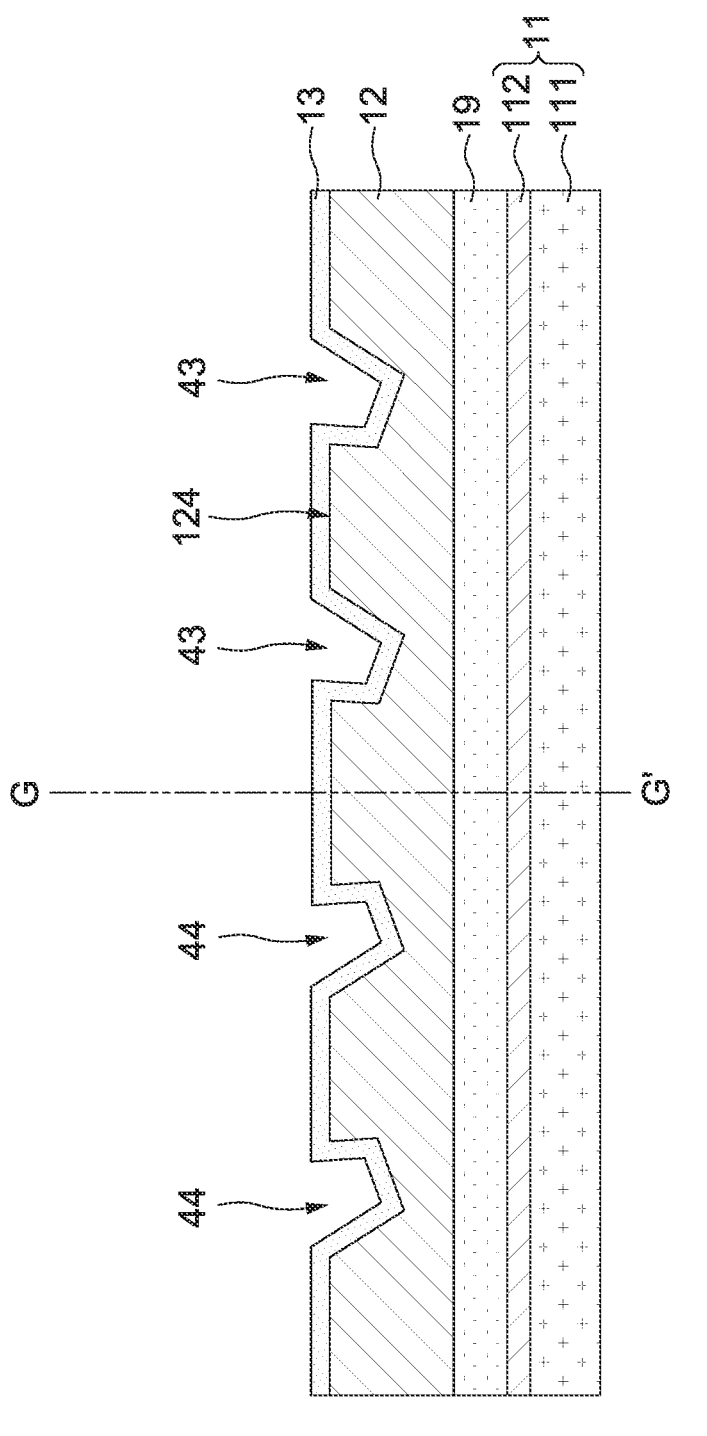
FIG. 16

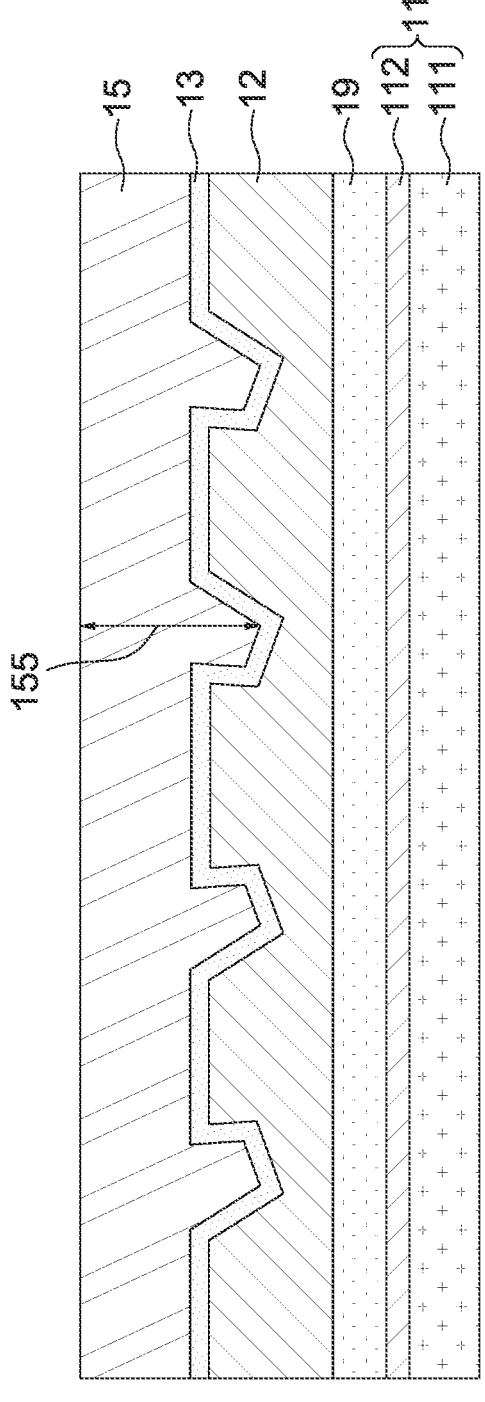
15
13
12
19
112
11
111
155
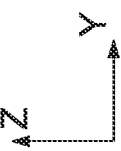
FIG. 17
Z
Y

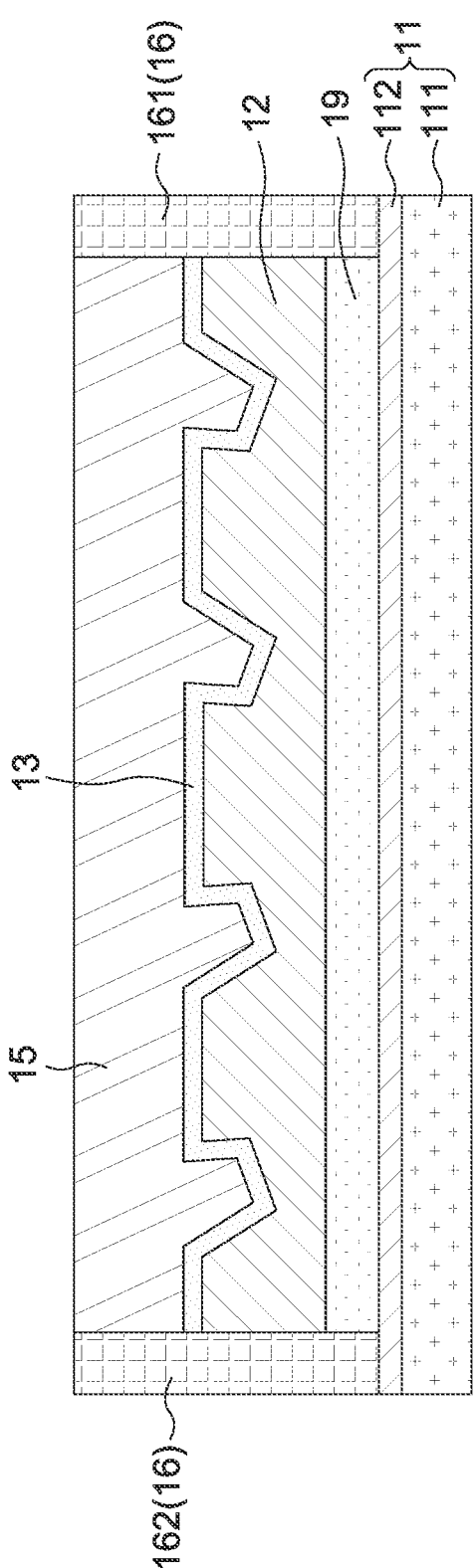
161(16)
12
19
112 ⎱11
111 ⎰
162(16)
13
15
FIG. 18
Z
Y

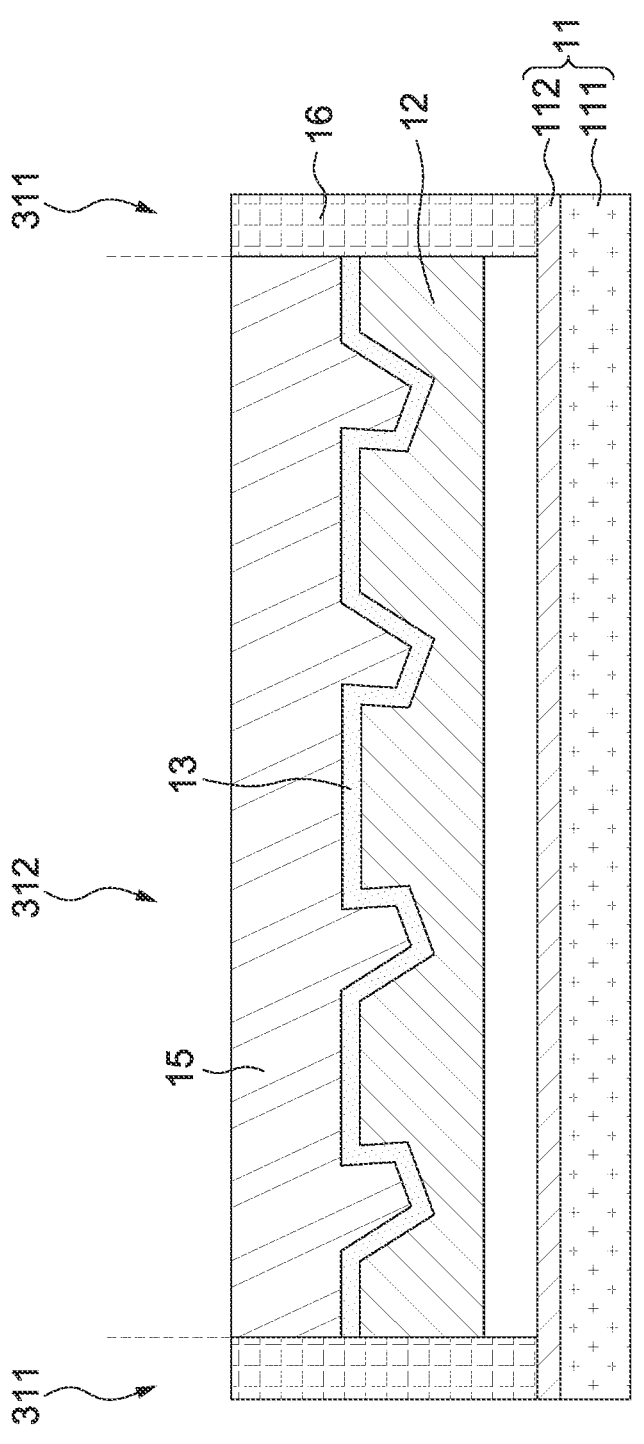
FIG. 19

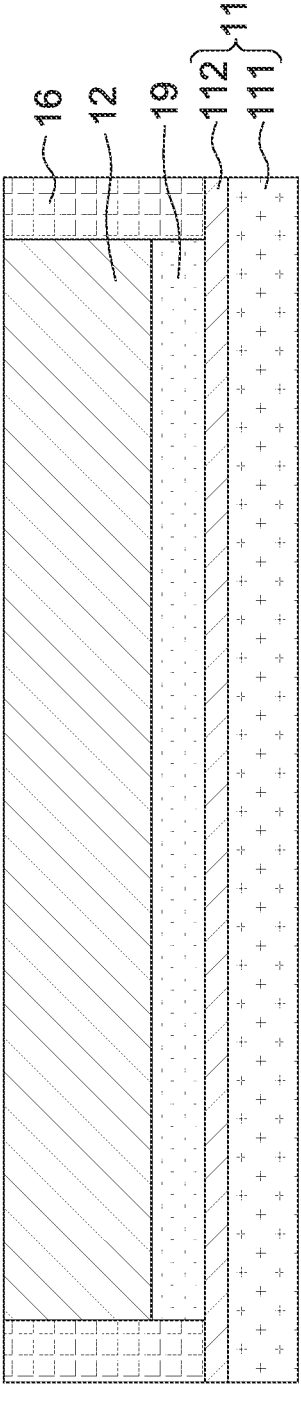
16
12
19
112
111 } 11
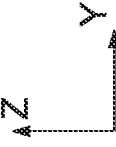
FIG. 20

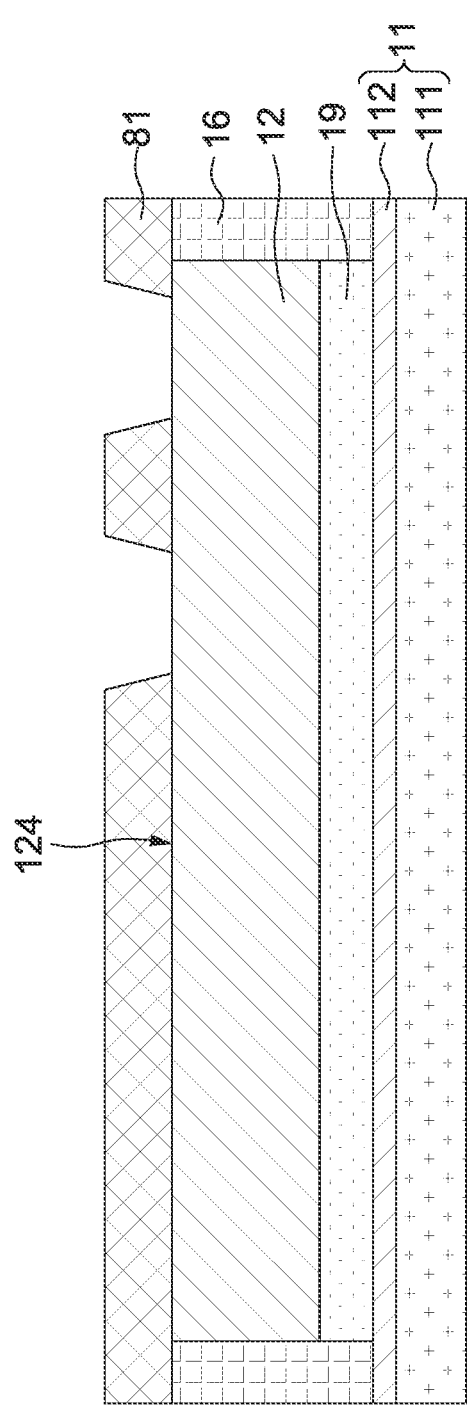
124
81
16
12
19
112 ⎫
111 ⎬ 11
FIG. 21

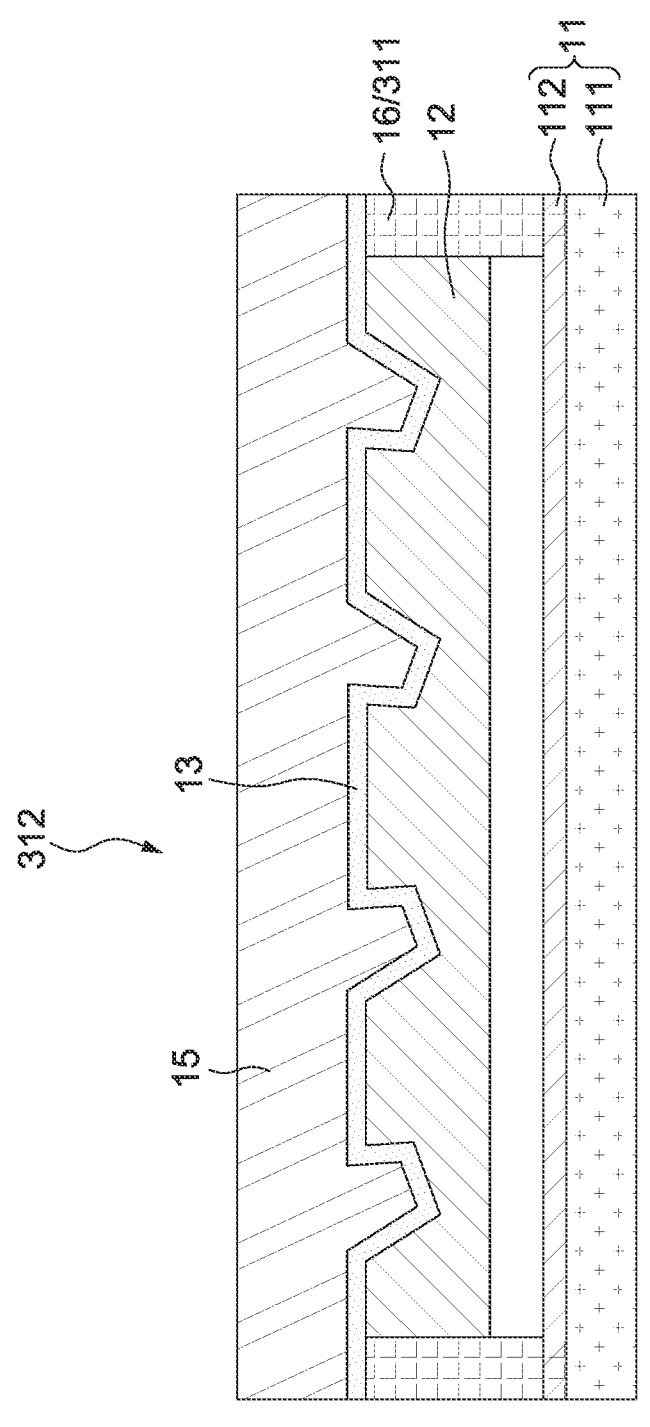
312
13
15
16/311
12
112
111 } 11
FIG. 22
Z
Y

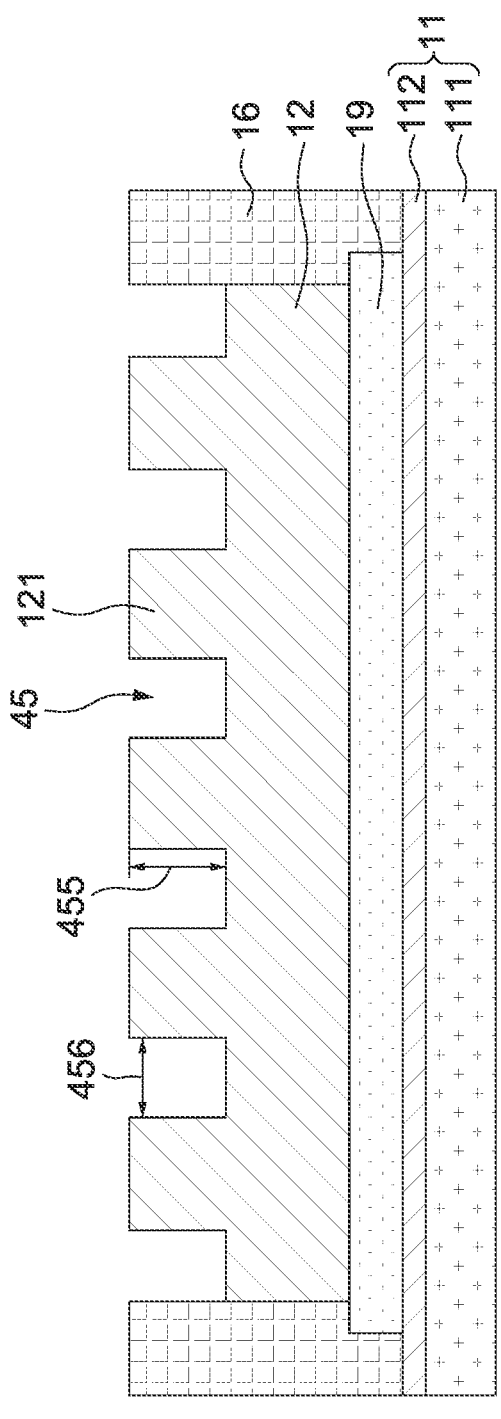
16
12
19
112
111 } 11
121
45
455
456
FIG. 24
Z
Y

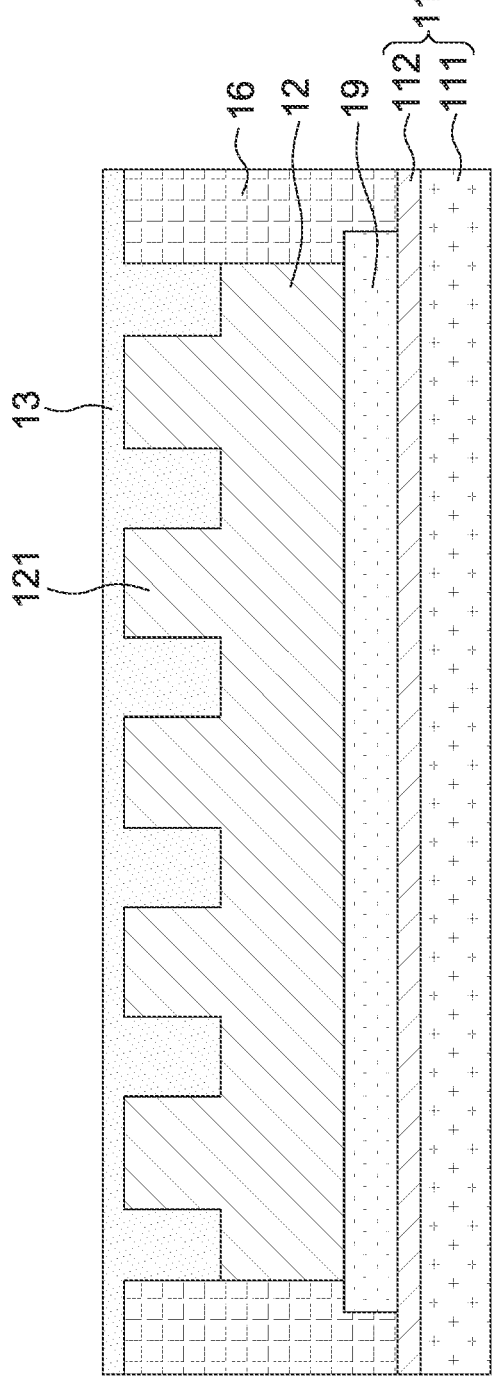
16
12
19
112
111
112
111 } 11
13
121
FIG. 25
Z
Y

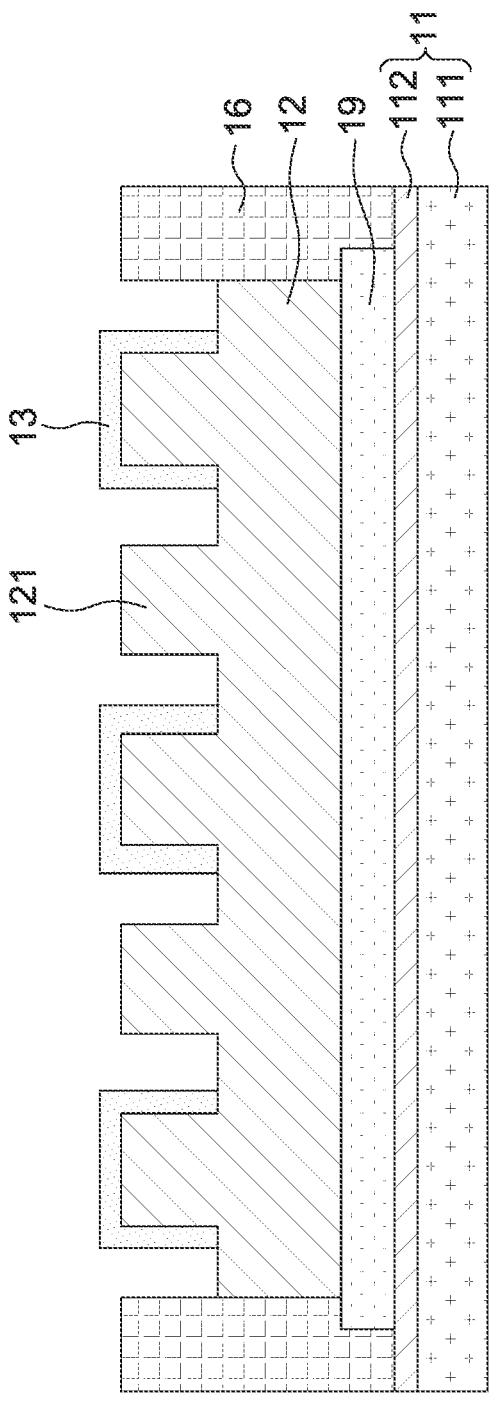
FIG. 26

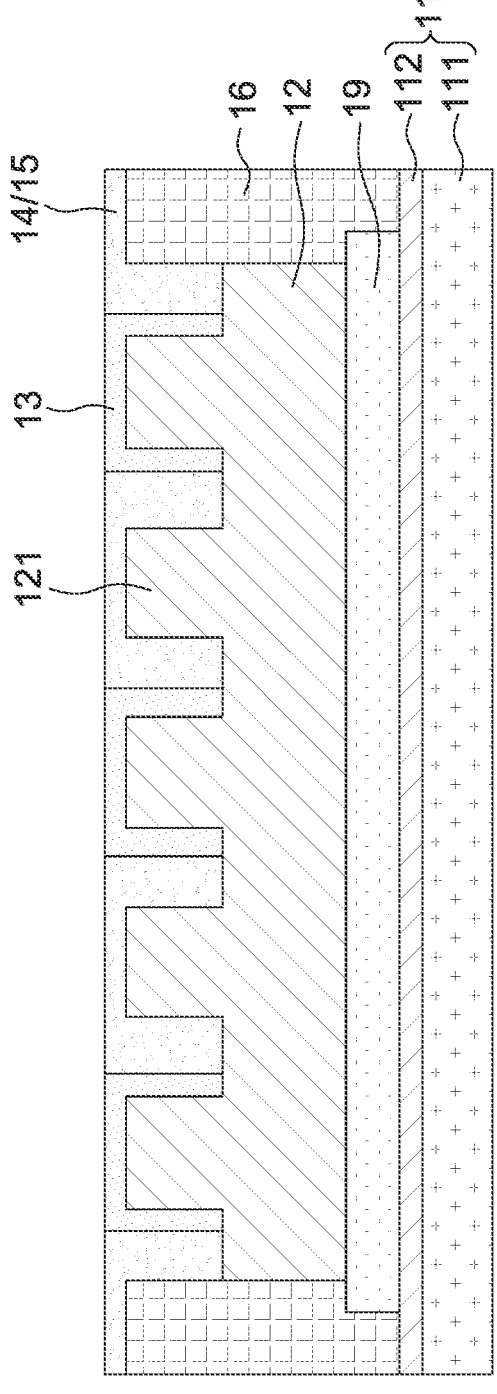
FIG. 27

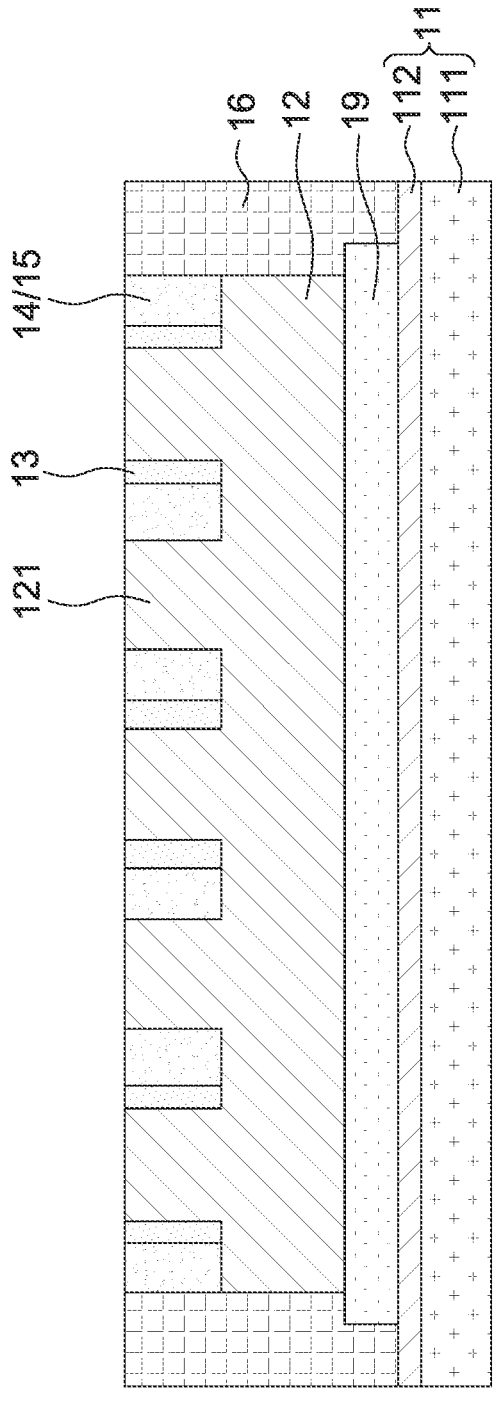
FIG. 28

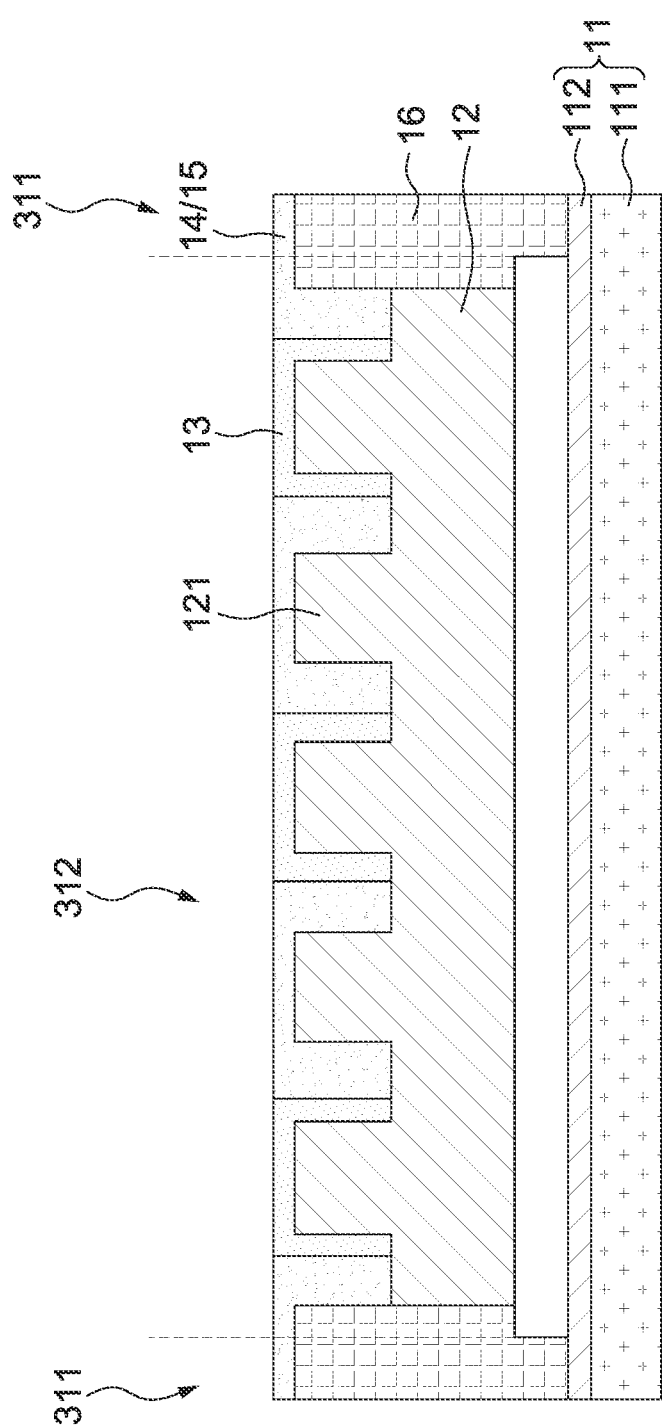
FIG. 29

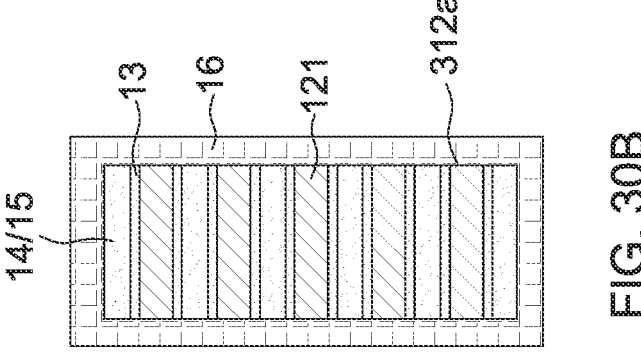
FIG. 30B
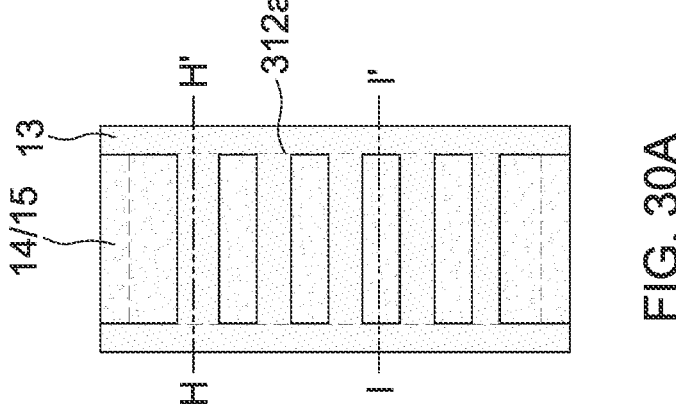
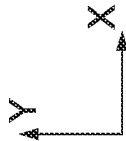
FIG. 30A

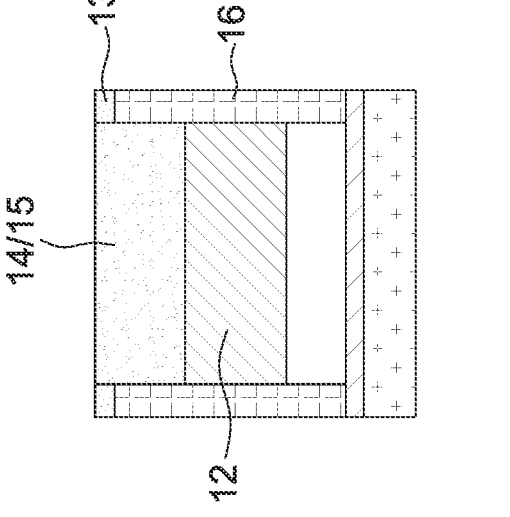
FIG. 31A
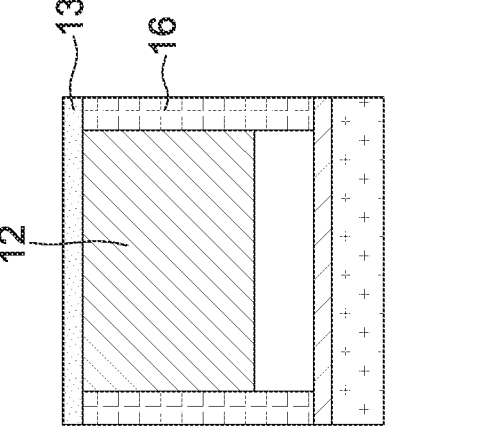
FIG. 31B
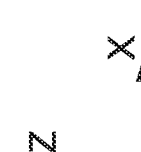

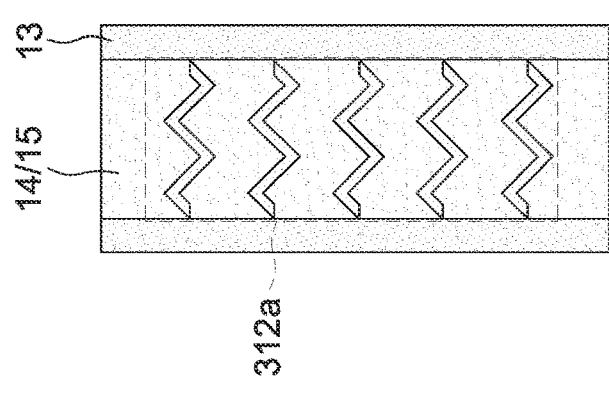
FIG. 32D
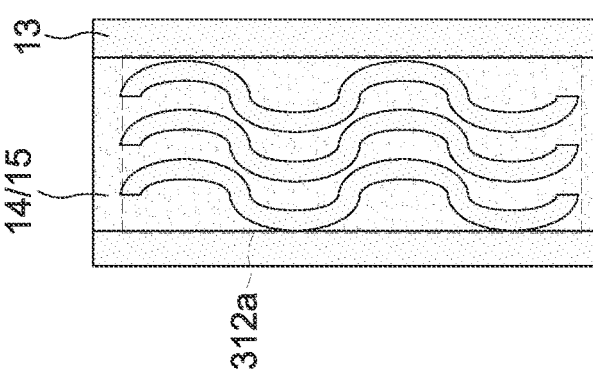
FIG. 32C
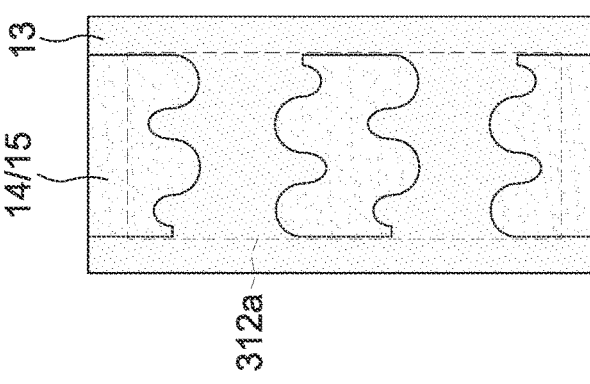
FIG. 32B
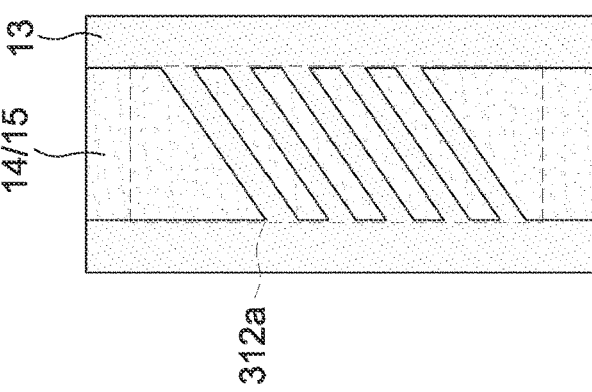
FIG. 32A
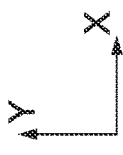

SEMICONDUCTOR STRUCTURE AND METHOD OF MANUFACTURING THE SAME

BACKGROUND

Recent developments in semiconductor integrated circuit (IC) technology include microelectromechanical system (MEMS) devices. MEMS devices include mechanical and electrical features formed by one or more semiconductor manufacturing processes. Examples of MEMS devices include micro-sensors, which convert mechanical force into electrical signals; micro-actuators, which convert electrical signals into mechanical force; and motion sensors, which are commonly found in automobiles (e.g., in airbag deployment systems). For many applications, MEMS devices include a floating fin, a membrane or a film suspended in air. Commonly, the floating or suspended structure can be easily damaged during motion. Improvements are therefore required.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 1 is a schematic top-view diagram of a semiconductor structure in accordance with some embodiments of the disclosure.

FIG. 2A is a schematic bottom-view perspective of a portion A of the semiconductor structure in FIG. 1 in accordance with some embodiments of the disclosure.

FIGS. 2B to 2C are schematic cross-sectional diagrams of a semiconductor structure in accordance with different embodiments of the disclosure.

FIG. 3A is a schematic bottom-view perspective of a portion B of the semiconductor structure in FIG. 1 in accordance with some embodiments of the disclosure.

FIGS. 3B to 3C are schematic cross-sectional diagrams of a semiconductor structure in accordance with different embodiments of the disclosure.

FIGS. 4 to 10 are schematic cross-sectional diagrams of a semiconductor structure at different stages of a manufacturing method in accordance with some embodiments of the disclosure.

FIGS. 12 to 19 are schematic cross-sectional diagrams of a semiconductor structure at different stages of a manufacturing method in accordance with some embodiments of the disclosure.

FIGS. 20 to 22 are schematic cross-sectional diagrams of a semiconductor structure at different stages of a manufacturing method in accordance with some embodiments of the disclosure.

FIGS. 24 to 29 are schematic cross-sectional diagrams of a semiconductor structure at different stages of a manufacturing method in accordance with some embodiments of the disclosure.

FIGS. 30A to 30B are schematic top-view diagrams of the structure of FIGS. 27 and 29 in accordance with some embodiments of the disclosure.

FIGS. 31A to 31B are schematic cross-sectional diagrams of along different cutting lines in FIG. 30A in accordance with some embodiments of the disclosure.

FIGS. 32A to 32D are schematic top-view perspectives of the structure of FIG. 29 in accordance with some embodiments of the disclosure.

DETAILED DESCRIPTION

Figures 6A, 6B:
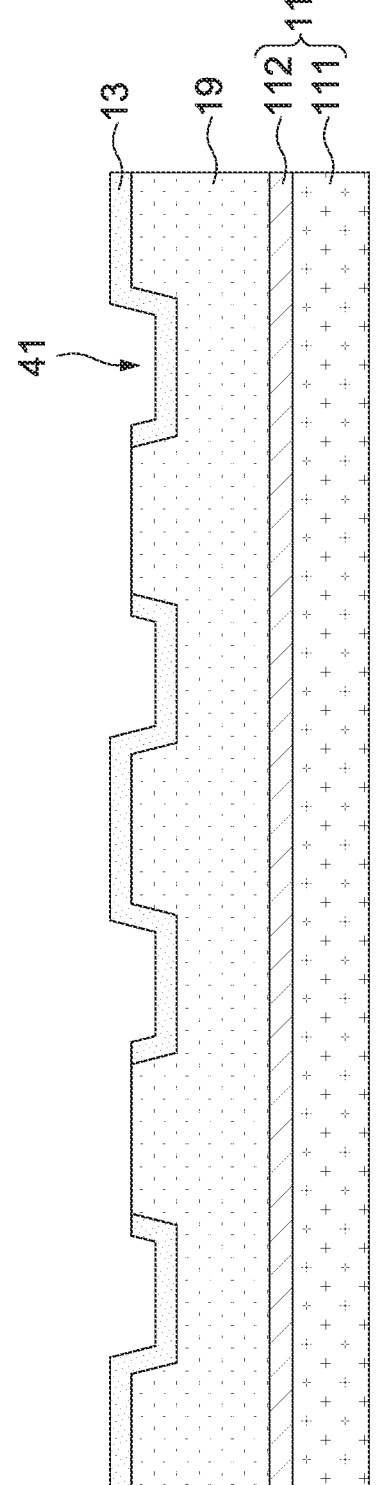

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context. In addition, the term "source/drain region" or "source/drain regions" may refer to a source or a drain, individually or collectively dependent upon the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
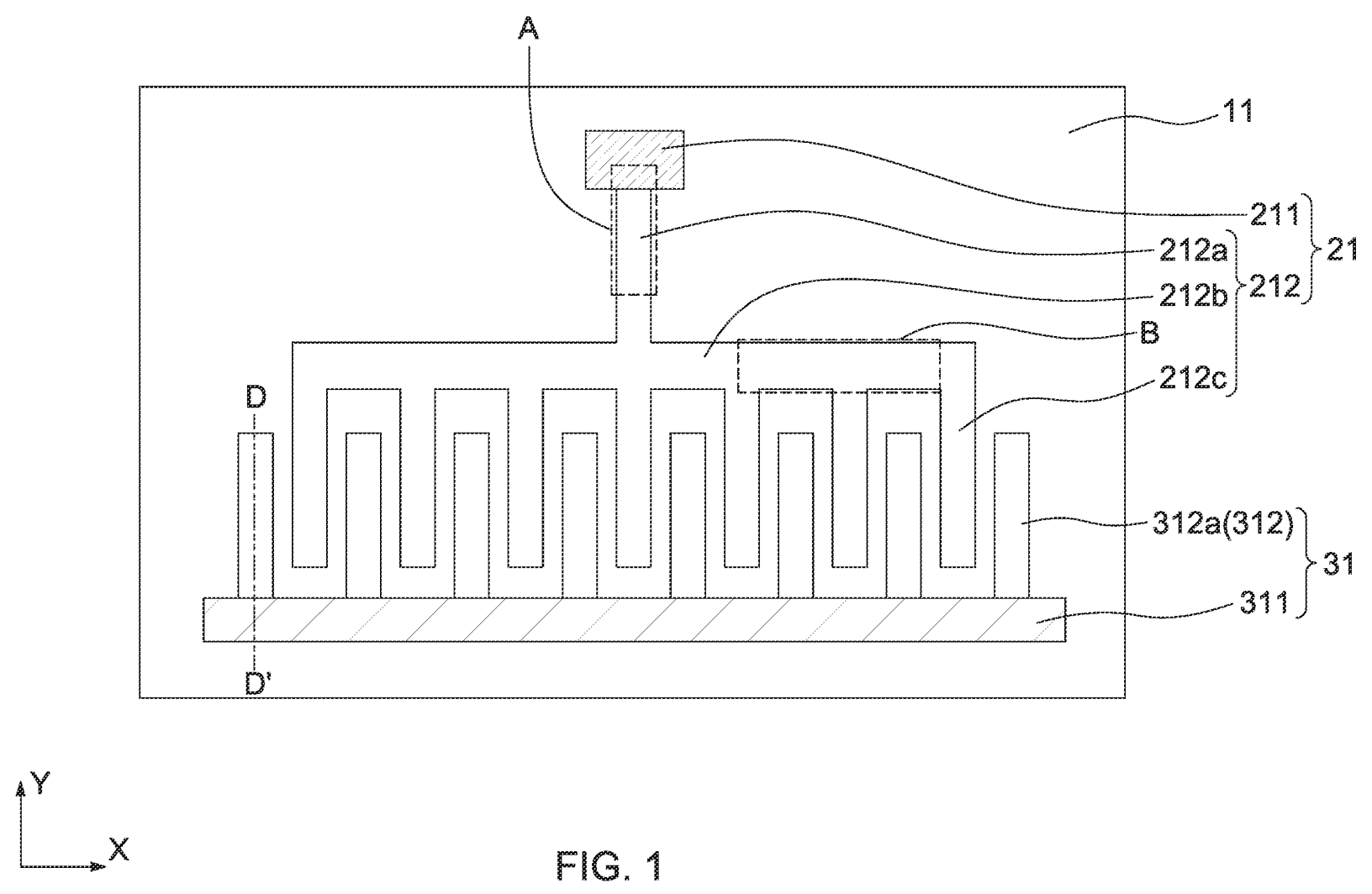

FIG. 1 is a schematic top view of a semiconductor structure in accordance with some embodiments of the present disclosure. The semiconductor structure can be a micro-electro-mechanical system (MEMS). The semiconductor structure includes a substrate 11, a first structure 21 and a second structure 31 disposed over the substrate 11. The semiconductor structure may include an accelerator, a fin structure, a gyroscope, a bond holder, a microphone, or a combination thereof. For a purpose of illustration, a gyroscope for detecting changes in capacitance along a direction X, as shown in FIG. 1, is used as an exemplary embodiment. In some embodiments, the first structure 21 and the second structure 31 are a first electrode 21 and a second electrode 31, respectively, of a gyroscope. In some embodiments, the first structure 21 or the second structure 31 may be referred to as a first fin structure or a second fin structure. For ease of description, the first structure 21 and the second structure 31 are referred to as the first electrode 21 and the second electrode 31 in the following description. Each of the first electrode 21 and the second electrode 31 may be an interdigital electrode. The first electrode 21 and the second electrode 31 may have similar or different configurations (e.g., a brush, a fish bone, a ring, or other configurations). For example, as shown in FIG. 1, the first electrode 21 and the second electrode 31 are both interdigital electrodes but with different configurations.

In some embodiments, the first electrode 21 includes a fixed member 211 and a floating member 212. The fixed member 211 can be a part of the first electrode 21 connected to, contacting, or fixed on the substrate 11, and the floating member 212 may be a part of the first electrode 21 separate from the substrate 11. The floating member 212 can be held on the substrate 11 through the support of the fixed member 211. In some embodiments, the fixed member 211 and the floating member 212 are conductive. In some embodiments, the floating member 212 is electrically connected to the substrate 11 through the fixed member 211.

Configurations of the fixed member 211 and the floating member 212 can be adjusted according to different applications. In some embodiments, the fixed member 211 has a rectangular configuration from a top view as shown in FIG. 1. In some embodiments, the fixed member 211 extends toward and surrounds at least a portion of the floating member 211 (not shown in FIG. 1; and related illustration is provided in relation to other embodiments in the following description). In some embodiments, the floating member 212 includes a first portion 212a, a second portion 212b and a third portion 212c. In some embodiments, the first portion 212a is connected to the fixed member 211, the second portion 212b is connected to the first portion 212a, and the third portion 212c is connected to the second portion 212b.

In some embodiments, the floating member 212 has a brush-like or a tree-like configuration. The first portion 212a can be considered as a trunk portion of the floating member 212, the second portion 212b can be considered as a branch portion branching out from the first portion 212a, and the third portion 212c can be considered as a leaf portion branching out from the second portion 212c. It should be noted that the wordings "trunk", "branch" and "leaf" are for a purpose of showing different layers of a hierarchy of the floating member 212 from the fixed member 211, and are not intended to limit the present disclosure.

In some embodiments, the first portion 212a extends along a first direction (e.g., a direction Y). In some embodiments, the second portion 212b extends along a second direction (e.g., the direction X) substantially perpendicular to the first direction. In some embodiments, the third portion 212c is substantially parallel to the first portion 212a. In some embodiments, the third portion 212c extends along the first direction. The third portion 212c may include several slots (or leaves) parallel to one another along the second direction. In some embodiments, each of the slots may include one free end and another end connected to the second portion 212b. A number of the slots of the third portion 212c is not limited herein. In some embodiments, the first portion 212a is connected to a middle of the second portion 212b for purpose of better support.

In accordance with some embodiments of the present disclosure, as shown in FIG. 1, the second electrode 31 may have a brush-like or a comb-like configuration, which is different from that of the first electrode 21. In some embodiments, the second electrode 31 includes a fixed member 311 and a floating member 312. Similar to the first electrode 21, the fixed member 311 may connect to, contact, or be fixed on the substrate 11, and the floating member 312 may be separate from the substrate 11. The floating member 312 can be held on the substrate 11 through the fixed member 311. In some embodiments, the fixed member 311 is considered as a base portion (or a backbone portion) of the second electrode 31, and the floating member 312 is considered as a leaf portion (or a teeth portion) of the second electrode 31.

In some embodiments, the fixed member 311 and the floating member 312 are conductive. In some embodiments, the floating member 312 is electrically connected to the substrate 11 through the fixed member 311. In some embodiments, the fixed member 311 extends along the second direction. In some embodiments, the floating member 312 includes several slots 312a parallel to one another and arranged along the second direction. In other embodiments, the slots 312a may be referred to as leaves 312a or teeth 312a. Each of the slots 312a is connected to the fixed member 311 at one end, and the other end of the slot 312a is free end extending toward the second portion 212b of the floating member 212. In some embodiments, the slots 312a of the floating member 312 are alternately arranged with the slots of the third portion 212c of the floating member 212 for a purpose of measurement of capacitances between the first electrode 21 and the second electrode 31. In some embodiments, each of the slots 312a is substantially parallel to the third portion 212c. In some embodiments, each of the slots 312a extends along the first direction. A number of the slots 312a of the floating member 312 is not limited herein. In some embodiments, a length of the fixed member 311 along the second direction is according to the number of the slots 312a or according to a total width of the floating member 312 along the second direction.

A layer of low-k dielectric material is formed on, disposed on or within, or included in at least a portion of the floating member (e.g., 212 and/or 312) as a buffering structure to absorb stress or force on the floating member or as a support structure to provide sustained force on the floating member and strengthen the structure. Details of the floating member 212 and/or the floating member 312 can be different according to different embodiments of the present disclosure.

Please refer to FIG. 2A, which is a schematic bottom view of a portion A of the first electrode 21 (indicated by dashed lines in FIG. 1) in accordance with some embodiments of the present disclosure. FIGS. 2B and 2C are schematic cross-sectional diagrams of the floating member 212 along a line E-E' in FIG. 2A according to different embodiments. In some embodiments, the floating member 212 includes a first conductive layer 12, and a first layer 13 is disposed on a bottom surface 125 of the first conductive layer 12. In some embodiments, a portion of the first conductive layer 12 is exposed through the first layer 13 as shown in the bottom view of FIG. 2A. A configuration of the exposed portion of the first conductive layer 12 can be a Z shape, as shown in FIG. 2A; however, the present disclosure is not limited herein. Other configurations of the exposed portion of the first conductive layer 12 as seen in the bottom view are illustrated in other embodiments in the following description.

In some embodiments, the first conductive layer 12 includes a plurality of recesses 42. In some embodiments, the first layer 13 lines at least a portion of the recesses 42. In some embodiments, the first layer 13 exposes a portion of the first conductive layer 12 outside the recesses 42 as shown in FIG. 2B. In some embodiments, the first layer 13 covers an entirety of the first conductive layer 12 in the recesses 42 as shown in FIG. 2B. In some embodiments, the first layer 13 exposes a portion of the first conductive layer 12 inside the recesses 42 as shown in FIG. 2C. In some embodiments, the first layer 13 covers an entirety of the first conductive layer 12 outside the recesses 42 as shown in FIG. 2C.

The bottom surface 125 includes a planar portion 125*a* and a concave portion 125*b*. In some embodiments, the planar portion 125*a* defines a portion of the bottom surface 125 outside the recesses 42. In some embodiments, the concave portion 125*b* defines a portion of the bottom surface 125 inside the recesses 42. In some embodiments, the first layer 13 exposes a portion of the planar portion 125*a* of the bottom surface 125 of the first conductive layer 12 as shown in FIG. 2B. In some embodiments, the first layer 13 covers an entirety of the concave portion 125*b* of the bottom surface 125 of the first conductive layer 12 as shown in FIG. 2B. In some embodiments, the first layer 13 exposes a portion of the concave portion 125*b* of the bottom surface 125 of the first conductive layer 12 as shown in FIG. 2C. In some embodiments, the first layer 13 covers an entirety of the planar portion 125*a* of the bottom surface 125 of the first conductive layer 12 as shown in FIG. 2C. In some embodiments, the first layer 13 further covers portions of the concave portion 125*b* between the planar portions 125*a*.

Please refer to FIG. 3A, which is a schematic bottom view of a portion B of the first electrode 21 in accordance with some embodiments of the present disclosure. FIGS. 3B and 3C are schematic cross-sectional diagrams of the floating member 212 along a line F-F' in FIG. 3A according to some embodiments of the present disclosure. Configurations of the first conductive layer 12, the first layer 13, and the portion of the exposed first conductive layer 12 through the first layer 13 can be similar to those described above. Repeated description is omitted herein. Similar configurations of such elements and similar arrangements between elements can be applied in or on different portions (e.g., 212*a*, 212*b* and 212*c*) of the floating member 212.

A method of manufacturing a semiconductor structure similar to the gyroscope shown in FIGS. 1 to 3 is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not in conflict.

FIGS. 4 to 10 are schematic cross-sectional diagrams along a line D-D' of the semiconductor structure in FIG. 1 at different stages of the method according to some embodiments of the present invention.

Referring to FIG. 4, a substrate 11 is provided, and a sacrificial layer 19 is formed over the substrate 11. In some embodiments, the substrate 11 includes a substrate layer 111 and a dielectric layer 112 over the substrate layer 111. The substrate layer 111 may be a bulk substrate (e.g., a silicon wafer) or a semiconductor-on-insulator (SOI) substrate. In one embodiment, the substrate layer 111 may include other semiconductor materials, such as silicon germanium, silicon carbide, gallium arsenide, or the like. In other embodiments, the substrate layer 111 may include semiconductor devices, electrical components, electrical elements or a combination thereof. In some embodiments, the substrate layer 111 includes transistors or functional units of transistors. The semiconductor devices, electrical components, or electrical elements may be formed in the substrate layer 111 following conventional methods of manufacturing semiconductors. The semiconductor devices, electrical components, or electrical elements can be active components or devices, and may include different types or generations of devices. The dielectric layer 112 can be a single layer or a multi-layer structure. In some embodiments, the dielectric layer 112 includes oxide, nitride, oxynitride or a combination thereof. In some embodiments, the dielectric layer 112 includes a pad oxide sub-layer and a silicon nitride sub-layer sequentially arranged over the substrate layer 111.

The sacrificial layer 19 may be formed over the substrate 11. In some embodiments, the sacrificial layer 19 includes silicon or other suitable materials, other than materials of a fixed member 311 and a floating member 312 to be formed for a purpose of selective etching. In some embodiments, a patterning operation is performed on the sacrificial layer 19 to form a plurality of recesses 41. In some embodiments, a depth 415 of the recesses 41 is in a range of 5 angstroms (Å) to 100 microns (µm). The presence of the recesses 41 is for a purpose of increasing surficial area of a first layer 13 to be formed in the subsequent processing, and a pattern of the recesses 41 from a top view is not limited herein. In some embodiments, a thickness 195 of the sacrificial layer 19 is in a range of 5 Å to 100 µm. In some embodiments, a distance 196 between the sacrificial layer 19 and a bottom of the recesses 41 defines a distance between the substrate 11 and a floating member to be formed. The distance 196 can be defined by the thickness 195 of the sacrificial layer 19 and the depth 415 of the recesses 41.

Referring to FIG. 5, the first layer 13 is formed in the recesses 41 and over the sacrificial layer 19. In some embodiments, the first layer 13 lines the recesses 41 and a top surface of the sacrificial layer 19. In some embodiments, a profile of the first layer 13 is conformal to a profile of the recesses 41 and the sacrificial layer 19. The first layer 13 may be formed by physical vapor deposition (PVD), chemical vapor deposition (CVD), plasma-enhanced CVD (PECVD), atomic layer deposition (ALD), or any other suitable process. In some embodiments, a thickness 135 of the first layer 13 is in a range of 5 Å to 1 μm. In some embodiments, the first layer 13 includes polysilicon, silicon oxide ($SiO_2$), phosphosilicate glass (PSG), fluorosilicate glass (FSG), silicon nitride (SiN), silicon oxynitride (SiON), silicon carbide (SiC), extra low-k materials (ELK), low-k materials (LK), hard black diamond (HBD), polysilicon, amorphous silicon, or a combination thereof. In some embodiments, the first layer 13 is referred to as a first layer 13. In some embodiments, the first layer 13 may be for a purpose of sustain forces or a purpose of stress absorption (illustrate is provided in the following description).

Figure 6C:
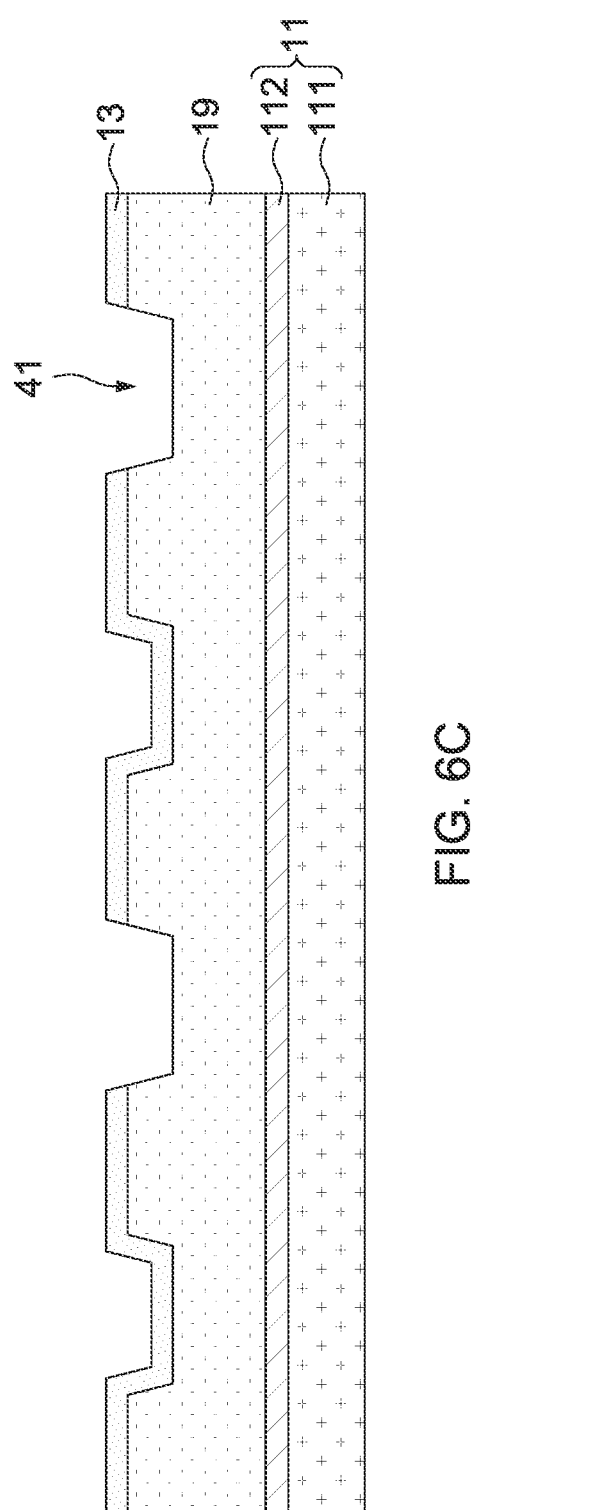
Figure 6D:
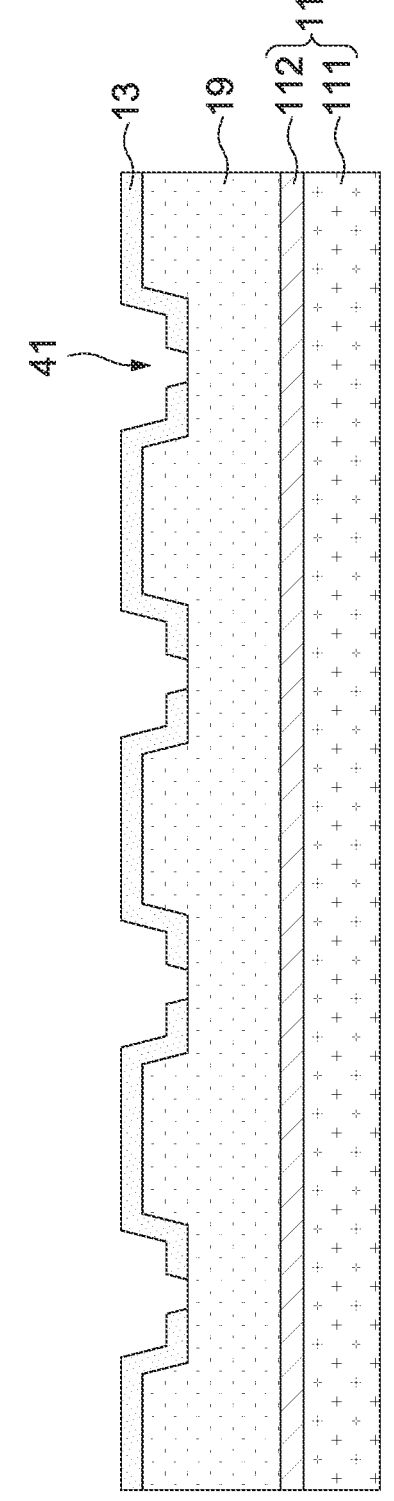

Referring to FIGS. 6A to 6D, a patterning operation is performed on the first layer 13 to remove portions of the first layer 13 and expose portions of the sacrificial layer 19. A pattern of the exposed portions of the sacrificial layer 19 is designed according to different requirements, and FIGS. 6A to 6D show different patterns of the exposed portions of the sacrificial layer 19 according to different applications of the present disclosure. In some embodiments, the first layer 13 on bottoms of some of the recesses 41 is removed as shown in FIG. 6A. In some embodiments, the first layer 13 on portions of the sacrificial layer 19 outside the recesses 41 is removed as shown in FIG. 6B. In some embodiments, an entirety of some of the recesses 41 is exposed by the patterning operation as shown in FIG. 6C. In some embodiments, portions of the sacrificial layer 19 outside the recesses 41 and portions of the sacrificial layer 19 inside the recesses 41 are exposed as shown in FIG. 6D. The patterning operation may include formation of a patterned photoresist layer on the first layer 13 and etching unwanted portions of the first layer 13 using the patterned photoresist layer as a mask. The patterned photoresist layer may be removed after the patterning operation on the first layer 13.

Referring to FIG. 7, a second layer 14 is optionally formed over the first layer 13 after the patterning operation. The second layer 14 is formed on the intermediate structure shown in FIG. 6A for a purpose of illustration, but it is not intended to limit the invention. In some embodiments, the second layer 14 lines the recesses 41 and the first layer 13. In some embodiments, a profile of the second layer 14 is conformal to a profile of the recesses 41 and the first layer 13. The second layer 14 may be formed by PVD, CVD, PECVD, ALD, or any other suitable process. In some embodiments, a thickness 145 of the second layer 14 is in a range of 5 Å to 1 μm. In some embodiments, the second layer 14 includes a material selected from the selection of the first layer 13 but different from that of the first layer 13. In some embodiments, the second layer 14 is referred to as a buffering layer.

Referring to FIG. 8, a supporting structure 16 is formed adjacent to the sacrificial layer 19 and the first layer 13. It should be noted that the supporting structure 16 is formed on the intermediate structure shown in FIG. 6A for a purpose of illustration but is not intended to limit the present disclosure.

Several operations may be performed to form the supporting structure 16. For example, one or more patterning operations are performed to remove portions of the first layer 13 and portions of the sacrificial layer 19, deposition of a material layer of the supporting structure 16 is performed, and a patterning operation is performed on the material layer to form the supporting structure 16. The supporting structure 16 can be made of dielectric materials, conductive materials, semiconductive materials, or a combination thereof. In some embodiments, the dielectric material includes nitride, oxide, oxynitride, or a combination thereof. In some embodiments, the conductive material includes copper (Cu), aluminum (Al), titanium (Ti), tantalum (Ta), lead (Pb), tungsten (W), an alloy thereof, or a combination thereof. In some embodiments, the semiconductive material includes polysilicon, doped polysilicon, germanium, or a combination thereof. In some embodiments, the supporting structure 16 includes a metallic material for a purpose of electrical connection to the floating member 312 and the substrate 11.

A portion or an entirety of the supporting structure 16 may become the fixed member 311 as shown in FIG. 1. In some embodiments, the supporting structure 16 includes a first portion 161 and a second portion 162 disposed at two opposite ends of the sacrificial layer 19. In some embodiments, the supporting structure 16 includes a first portion 161 and a second portion 162 disposed at two opposite ends of the floating member 312 to be formed in the subsequent processing. In some embodiments, the first portion 161 is connected to or contacts the substrate 11 and becomes the fixed member 311 shown in FIG. 1. In some embodiments, the second portion 162 is separated from the substrate 11 by the sacrificial layer 19. In some embodiments, the second portion 162 is disposed at a free end of the floating member 312 shown in FIG. 1. In some embodiments, the second portion 162 can enhance a structural integrity of the floating member 312. In some embodiments, the second portion 162 is considered as a portion of the floating member 312.

Figure 9:
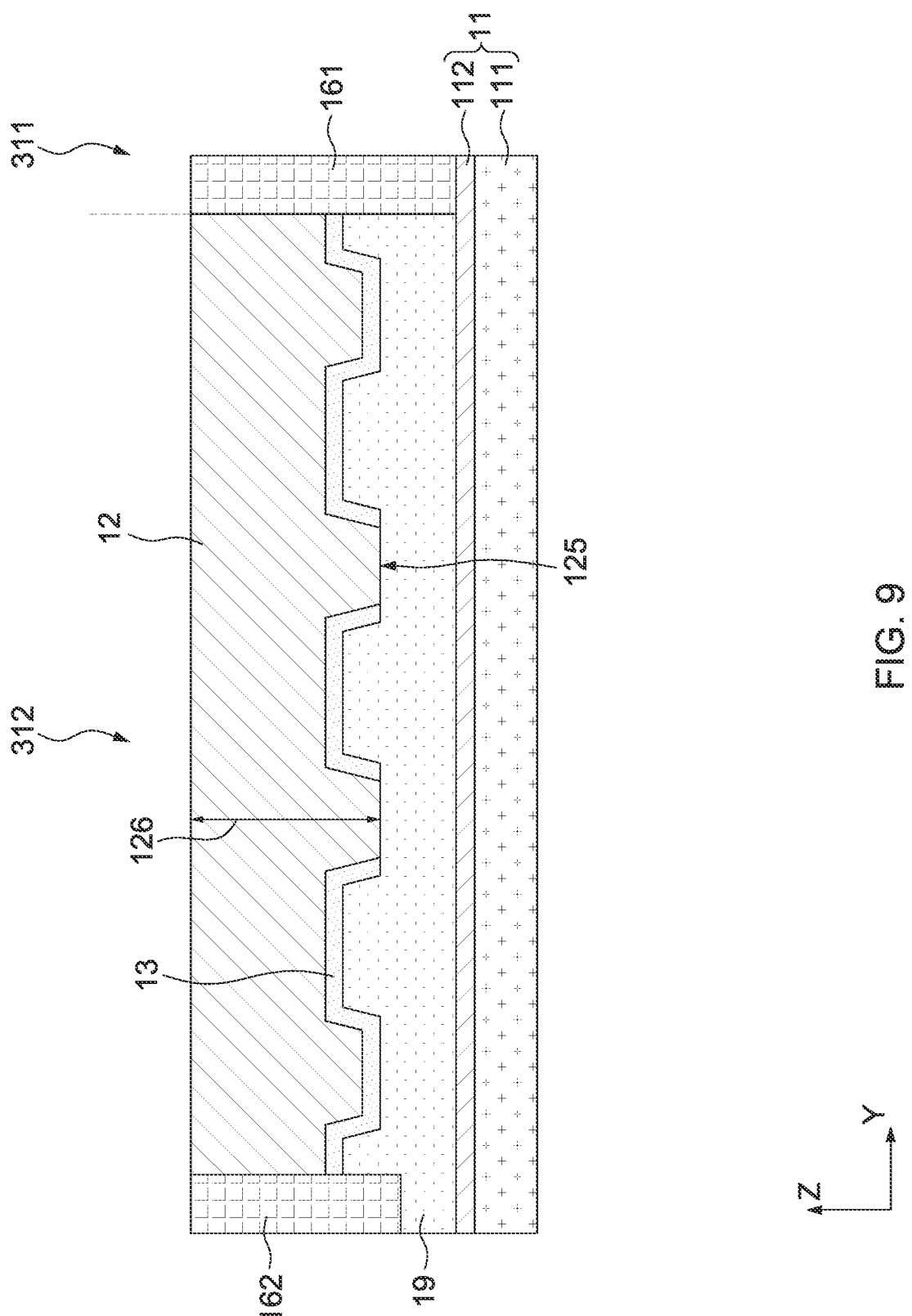

Referring to FIG. 9, a first conductive layer 12 is formed over the sacrificial layer 19 and the first layer 13 and between the first portion 161 and the second portion 162 of the supporting structure 16. The first conductive layer 12 may include a conductive material from the selection of materials of the supporting structure 16 as described above. The first conductive layer 12 and the supporting structure 16 may have same or different conductive materials depending on different applications. In some embodiments, the first conductive layer 12 and the supporting structure 16 are electrically connected. In some embodiments, the first conductive layer 12 contacts the supporting structure 16. In some embodiments, a thickness 126 of the first conductive layer 12 is in a range of 10 nanometers (nm) to 200 μm.

A profile of the first conductive layer 12, especially a profile of a bottom surface 125 of the first conductive layer 12, is defined by a profile of the first layer 13 and the sacrificial layer 19. Portions of the first conductive layer 12 may contact the first layer 13, and portions of the first conductive layer 12 may contact the sacrificial layer 19. In some embodiments, the first conductive layer 12 is formed by a deposition followed by a patterning operation to form a slot-like configuration of the floating member 312 as shown in FIG. 1. Other configurations, such as tree-like or brush-like configurations of the floating member 212 shown in FIG. 1, may be formed by the patterning operation depending on different applications.

Figure 10:
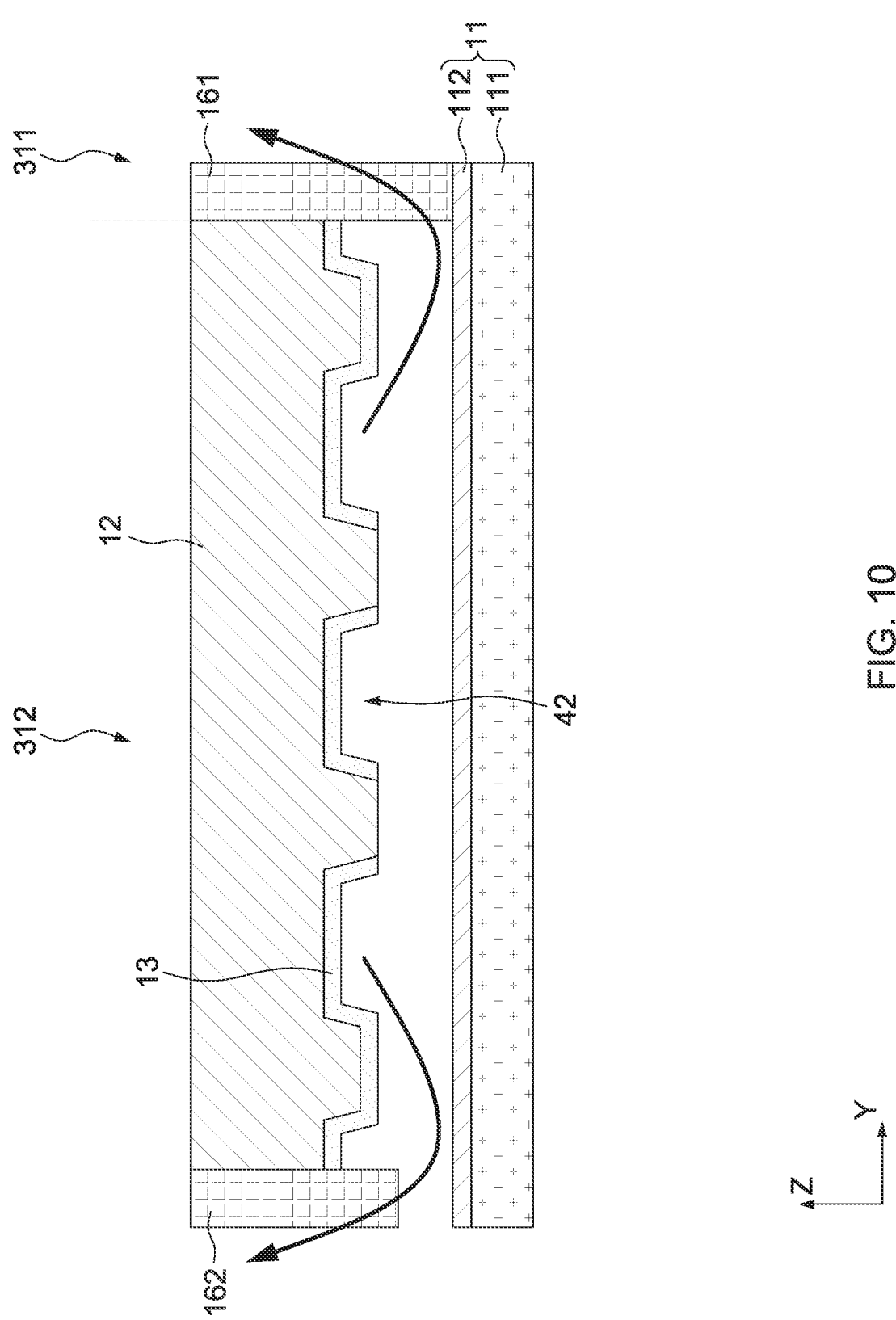

Referring to FIG. 10, the sacrificial layer 19 is removed. In some embodiments, an etching operation is performed to remove the sacrificial layer 19. In some embodiments, the etching operation includes a high selectivity to the material of the sacrificial layer 19. The free end (i.e., the end where the second portion 162 is disposed) of the floating member 312 may fall and the floating member 312 may tilt due to gravity, and the structure can be damaged after a period time of use. In order to enhance a structural integrity of the floating member 312, an annealing operation may be performed on the first layer 13 in embodiments where first layer 13 comprises silicon nitride. In some embodiments, the first layer 13 is made of silicon nitride and can provide sustained forces on the first conductive layer 12 after the annealing operation due to material properties. Directions of the sustain forces of the first layer 13 are indicated by arrows in FIG. 10, and thus the structural integrity of the floating member 312 is enhanced. The annealing operation can be performed prior to or after the removal of the sacrificial layer 19, and is not limited herein.

The structural integrity of the floating member 312 may or may not be affected by gravity depending on a length of the floating member 312 from the fixed member 311. In other embodiments, the annealing operation is omitted, and the first layer 13 functions as a buffering layer for a purpose of stress release or stress absorption from the first conductive layer 12 of the floating member 312. In some embodiments, for a purpose of both applying sustained force and absorbing stress, the operations depicted in FIGS. 8 to 10 are performed on the intermediate structure of FIG. 7, and the annealing operation is performed on the first layer 13 made of silicon nitride.

Figures 11A, 11B, 11C, 11D, 11E:
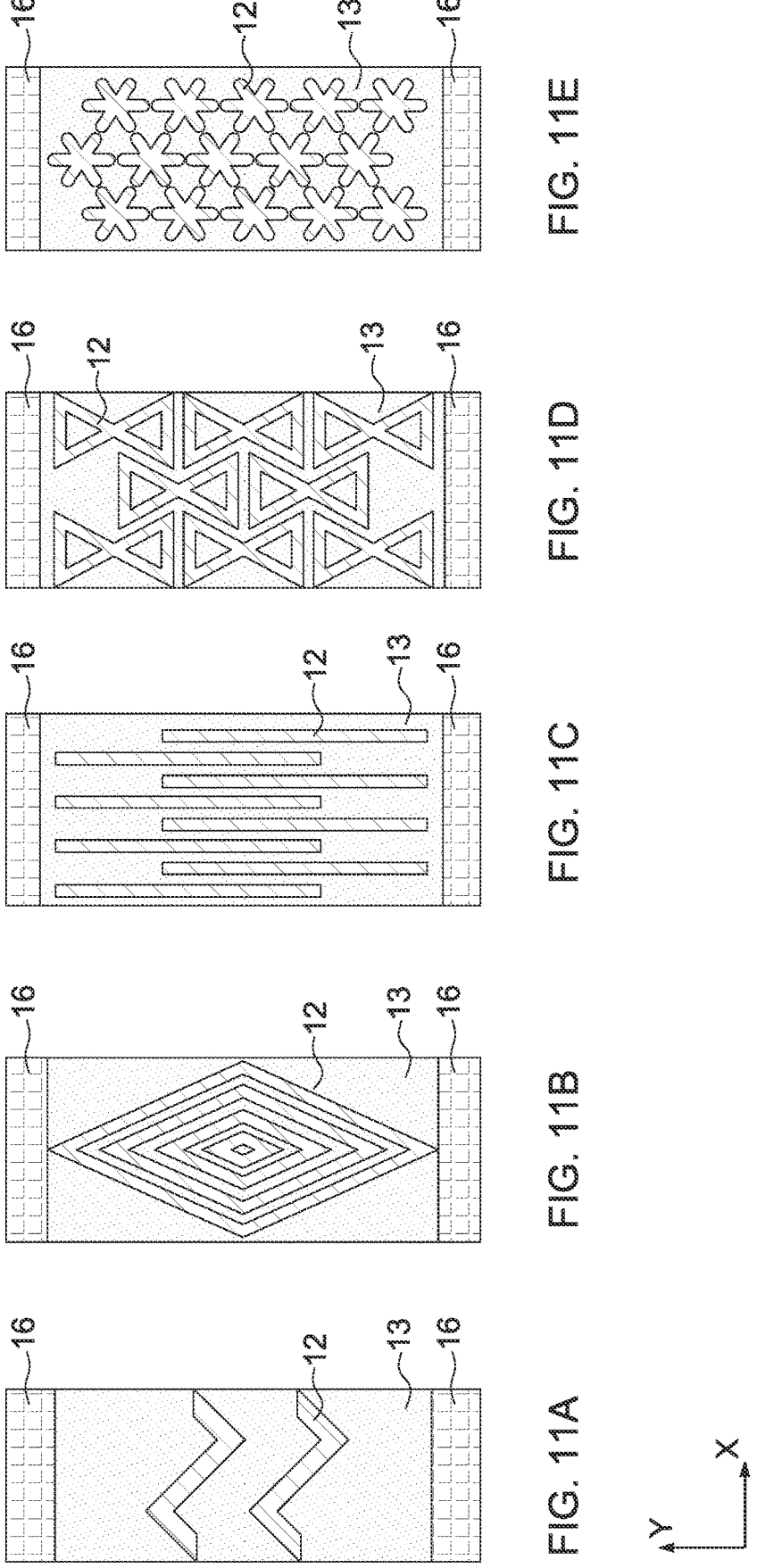
FIGS. 11A to 11E are schematic bottom-view perspectives of the structure of FIG. 10 in accordance with some embodiments of the disclosure.

The patterning operation on the first layer 13 as depicted in FIGS. 6A to 6D is for a purpose of adjustment and control of the sustained forces by the first layer 13 on the floating member 312. As described above, a pattern of the exposed portions of the first conductive layer 12 as seen from a bottom view of the floating member can be adjusted according to different applications. A bottom view perspective of the intermediate structure shown in FIG. 10 (i.e., a bottom view with the substrate 11 absent) is also provided in each of FIGS. 11A to 11E, and patterns of the exposed portions of the first conductive layer 12 can be different in accordance with different embodiments. In some embodiments, a configuration of the exposed portions of the first conductive layer 12 can include multiple Z shapes as shown in FIG. 11A. In some embodiments, the exposed portions of the first conductive layer 12 form a configuration of concentric diamond shapes as shown in FIG. 11B. In some embodiments, the exposed portions of the first conductive layer 12 form a configuration of multiple straight lines along a length of the floating member 312 as shown in FIG. 11C. In some embodiments, the exposed portions of the first conductive layer 12 form a configuration of multiple bowties as shown in FIG. 11D. In some embodiments, the exposed portions of the first conductive layer 12 form a configuration of multiple asterisks as shown in FIG. 11E.

Therefore, the invention provides a MEMS structure having a capping layer in a floating structure and a method for forming the same. The capping layer includes silicon nitride and can provide a sustained force to the floating structure after an annealing operation. A structural integrity of the floating structure is enhanced. In addition to the purpose of providing a sustained force, the capping layer can absorb stress from the floating structure if no annealing is performed. Damage to the floating structure during operation (e.g., measuring of orientation or velocity) of a device can be prevented. A lifetime of the device is thereby improved.

To achieve the purposes illustrated above, the present disclosure provides alternative methods and structures under a same concept of the invention. FIGS. 12 to 18 are schematic cross-sectional diagrams along the line D-D' of the semiconductor structure in FIG. 1 at different stages of a method according to an embodiment of the present invention. FIGS. 19 to 20 are schematic cross-sectional diagrams along the line D-D' of the semiconductor structure in FIG. 1 at different stages of the method according to another embodiment of the present invention. FIGS. 22 to 26 are schematic cross-sectional diagrams along the line D-D' of the semiconductor structure in FIG. 1 at different stages of the method according to another embodiment of the present invention.

Referring to FIG. 12, a substrate 11 is provided, and a sacrificial layer 19, a first conductive layer 12 and a first photoresist layer 81 are sequentially formed over the substrate 11. The first photoresist layer 81 exposes portions of the first conductive layer 12. The first photoresist layer 81 can be formed by conventional methods, and is not limited herein.

Figure 13:
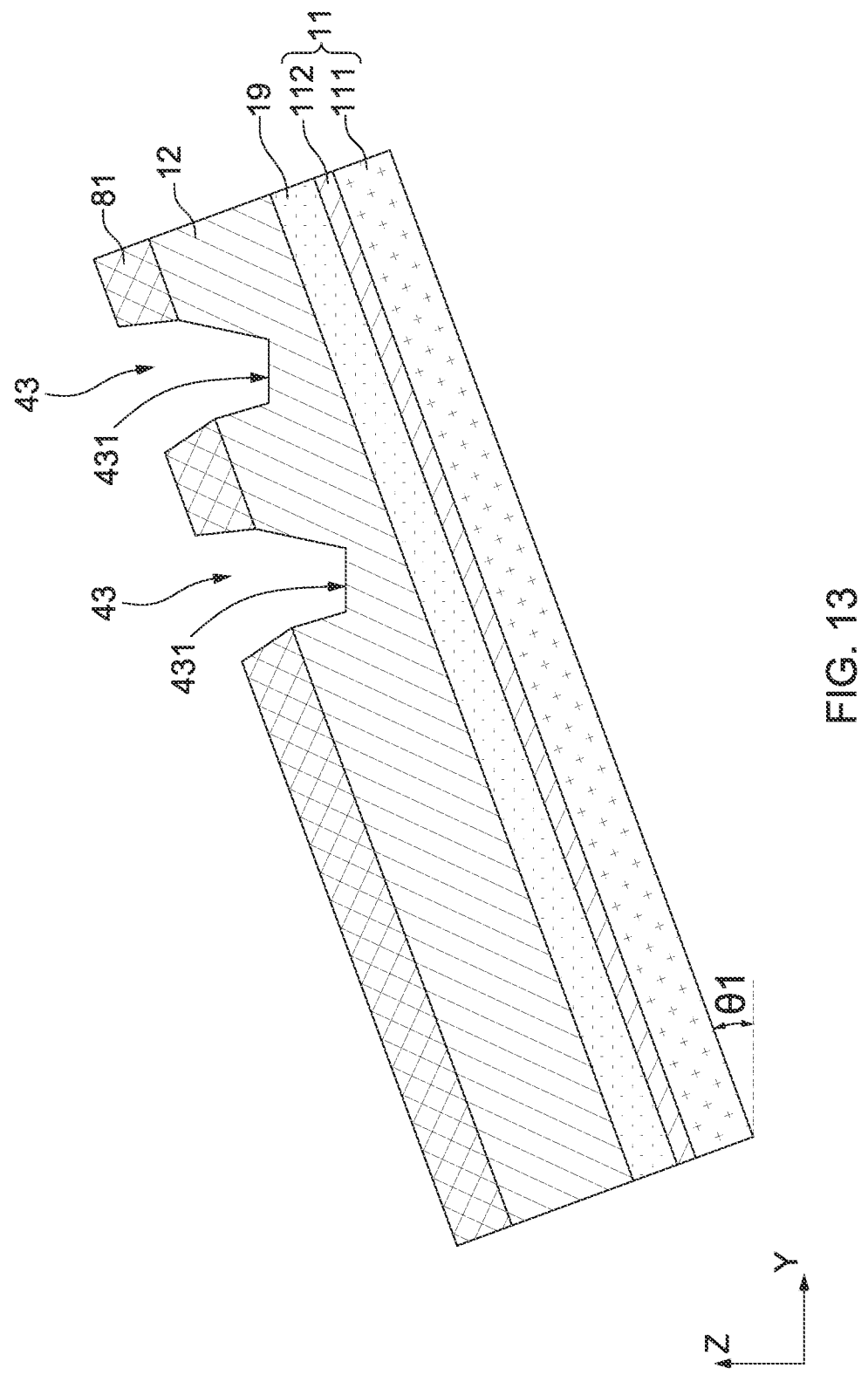

Referring to FIG. 13, a first patterning operation is performed on the first conductive layer 12 with a tilt angle $\theta1$. In some embodiments, an intermediate structure of FIG. 12 is disposed on a stage (e.g., an e-chuck in an etching chamber). In some embodiments, the intermediate structure or the stage is tilted or turned counter-clockwise to the tilt angle $\theta1$, wherein the tilt angle $\theta1$ is in a range of +1 to +45 degrees. For ease of understanding, an amount of rotation of a surface/line/subject from its initial position to a final position in a counterclockwise direction is defined herein as a positive angle, while a clockwise direction is defined herein as a negative direction. In some embodiments, a first etching operation having a downward direction is performed on the first conductive layer 12 using the first photoresist layer 81 as a mask to from a plurality of recesses 43. Each of the recesses 43 may have a bottom surface 431 being substantially planar along a horizontal direction (e.g., the direction Y) at this stage.

Figure 14:
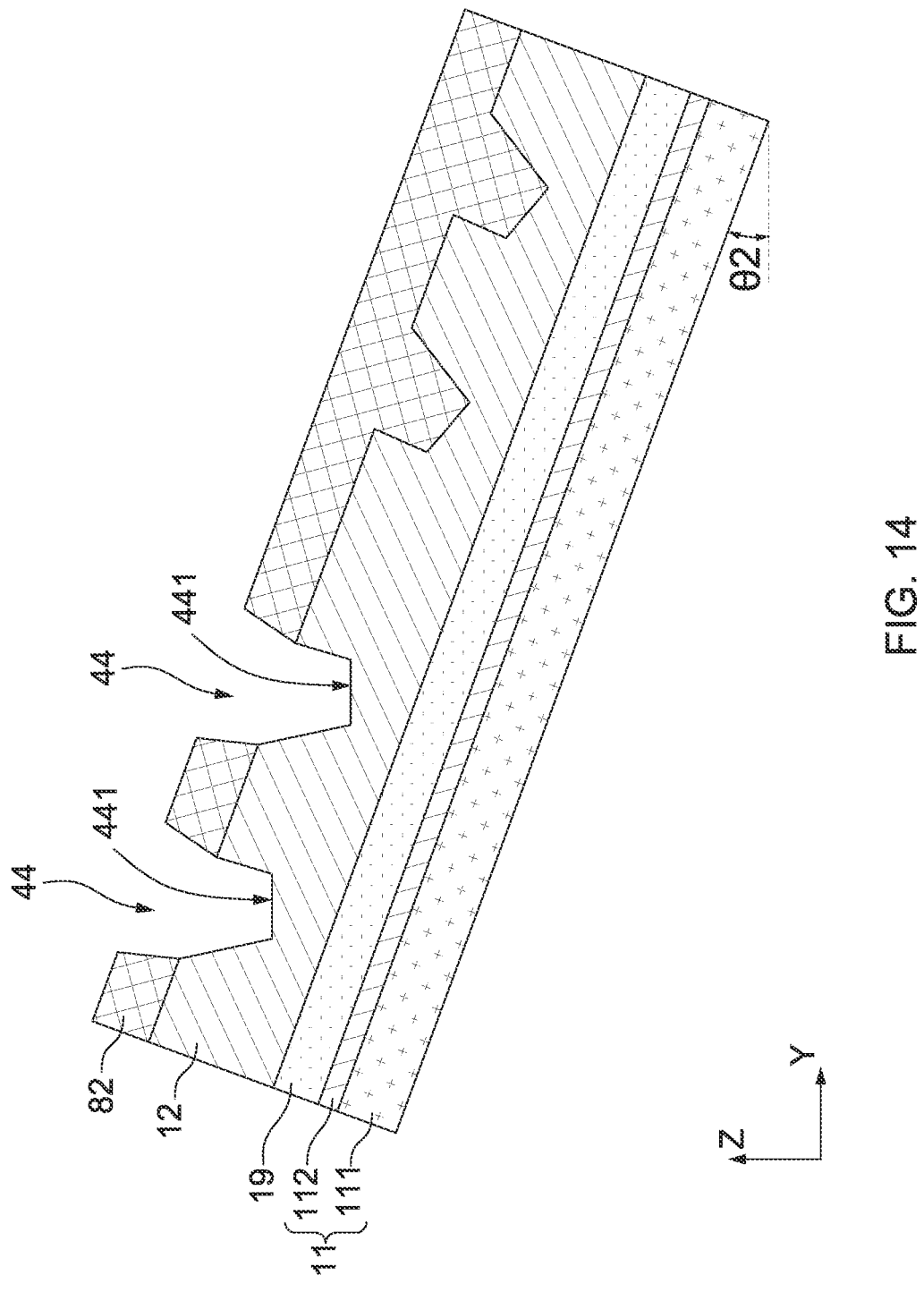

Referring to FIG. 14, a second patterning operation is performed on the first conductive layer 12 with a tilt angle $\theta2$. In some embodiments, prior to the second patterning operation, the first photoresist layer 81 is removed and a second photoresist layer 82 is formed on the first conductive layer 12. In some embodiments, the intermediate structure is then disposed on a stage (e.g., an e-chuck in an etching chamber) after the formation of the second photoresist layer 82. In some embodiments, the intermediate structure or the stage is tilted or turned clockwise to the tilt angle $\theta2$, wherein the tilt angle $\theta2$ is in a range of −1 to −45 degrees. In some embodiments, an absolute value of the tilt angle $\theta2$ is substantially equal to an absolute value of the tilt angle $\theta1$. In some embodiments, a second etching operation having a downward direction is performed on the first conductive layer 12 using the second photoresist layer 82 as a mask to from a plurality of recesses 44. Each of the recesses 44 may have a bottom surface 441 being substantially planar along a horizontal direction (e.g., the direction Y) at this stage.

Referring to FIG. 15, the second photoresist layer 82 is removed, and the substrate 11 is disposed to its initial orientation along the horizontal direction (i.e., the direction Y). In some embodiments, the recesses 43 and 44 are substantially symmetrical with respect to a line G-G'. In some embodiments, a top surface 124 of the first conductive layer 12 includes a planar portion 124a, a first concave portion 124b and a second concave portion 124c. The planar portion 124a may include portions of the top surface 124 outside the recesses 43 and 44, the first concave portion 124b may include portions of the top surface 124 inside the recesses 43, and the second concave portion 124c may include portions of the top surface 124 inside the recesses 44.

In some embodiments, the first concave portion 124b includes a first tilted surface 124d having a tilt angle $\theta3$ with respect to a bottom surface 125 of the first conductive layer 12. In some embodiments, an absolute value of the tilt angle θ3 is substantially equal to an absolute value of the tilt angle θ1. In some embodiments, the second concave portion 124c includes a second tilted surface 124e having a tilt angle θ4 with respect to the bottom surface 125 of the first conductive layer 12. In some embodiments, an absolute value of the tilt angle θ4 is substantially equal to an absolute value of the tilt angle θ2. In some embodiments, the tilt angle θ3 is substantially equal to the tilt angle θ4 in an opposite direction. In some embodiments, a depth 435 of the recesses 43 is in a range of 5 Å to 100 µm. In some embodiments, a depth 445 of the recesses 44 is substantially equal to the depth 435 of the recesses 43.

Referring to FIG. 16, a first layer 13 is formed over the first conductive layer 12. The first layer 13 may be formed in the recesses 43 and 44. In some embodiments, the first layer 13 lines the recesses 43 and 44. In some embodiments, a profile of the first layer 13 is conformal to a profile of the top surface 124 of the first conductive layer 12. In some embodiments, a thickness 135 of the first layer 13 is in a range of 5 Å to 1 µm. In some embodiments, the first layer 13 includes polysilicon, silicon oxide (SiO₂), phosphosilicate glass (PSG), fluorosilicate glass (FSG), silicon nitride (SiN), silicon oxynitride (SiON), silicon carbide (SiC), extra low-k materials (ELK), low-k materials (LK), hard black diamond (HBD), polysilicon, amorphous silicon, or a combination thereof.

Referring to FIG. 17, the operation as depicted in FIG. 9 is performed on the intermediate structure of FIG. 16 to from a second conductive layer 15 over the first layer 13. It should be noted that the patterning operation as depicted in FIGS. 6A to 6D and/or the operations as depicted in FIG. 7 may be performed prior to the formation of the second conductive layer 15, and it is not limited herein. A material of the second conductive layer 15 may be same as or different from that of the first conductive layer 12. The material of the second conductive layer 15 may be one or more of the possible materials of the first layer 13 as described above, and repetition is omitted herein. In some embodiments, the second conductive layer 15 covers an entirety of the first layer 13 and the first conductive layer 12. In some embodiments, the second conductive layer 15 is separated from the first conductive layer 12 by the first layer 13. In some embodiments, a thickness 155 of the second conductive layer 15 is in a range of 10 nm to 200 µm.

Referring to FIG. 18, the operations as depicted in FIG. 8 are performed on the intermediate structure of FIG. 17 to form a supporting structure 16. The supporting structure 16 can be similar to the supporting structure 16 shown in FIG. 8, but a second portion 162 of the supporting structure 16 is connected to or contacts the substrate 11. The first conductive layer 12, the second conductive layer 15 and the supporting structure 16 can have same or different conductive materials depending on different applications. In some embodiments, the first conductive layer 12 and the second conductive layer 15 are electrically connected through the supporting structure 16. In some embodiments, the first conductive layer 12 and the second conductive layer 15 respectively contact the supporting structure 16. In some embodiments, the second portion 162 can enhance a structural integrity of the floating member 311. In some embodiments, the second portion 162 is considered a portion of the fixed member 311 at the free end of the floating member 312 (not shown in FIG. 1).

Referring to FIG. 19, the operations as depicted in FIG. 10 are performed on the intermediate structure of FIG. 18 to from a semiconductor structure shown in FIG. 19. Similar to the operations described above, in embodiments where the first layer 13 is made of silicon nitride, an annealing operation is optionally performed. In some embodiments, an entirety of the supporting structure 16 is considered as the fixed member 311, and the first conductive layer 12 and the second conductive layer 15 together are considered as the floating member 312. It should be noted that the presence of the second conductive layer 12 is for a purpose of enhancement of structural integrity. In alternative embodiments, the formation of the second conductive layer 15 is omitted, and a height of the supporting structure 16 is reduced to align a top of the supporting structure 16 with a top of the first layer 13.

In the embodiments shown in FIGS. 12 to 19, the supporting structure 16 is formed after the formation of the second conductive layer 15. In alternative embodiments, the supporting structure 16 is formed prior to the formation of the first layer 13.

Referring to FIG. 20, in some embodiments, the supporting structure 16 is formed after the formation of the first conductive layer 12. In some embodiments, the operations as depicted in FIG. 8 are performed after the formation of the first conductive layer 12. In some embodiments, a planarization is performed after a deposition of the supporting structure 16. In some embodiments, a top surface 124 of the first conductive layer 12 is a substantially planar surface at this stage. In some embodiments, the top surface 124 of the first conductive layer 12 is substantially aligned with the top surface of the supporting structure 16. In some embodiments, the top surface 124 of the first conductive layer 12 and the top surface of the supporting structure 16 are substantially coplanar.

Referring to FIG. 21, a first photoresist layer 81 is formed over the first conductive layer 12 after the formation of the supporting structure 16. In some embodiments, the first photoresist layer 81 covers the first conductive layer 12 and the supporting structure 16. In some embodiments, the first photoresist layer 81 covers an entirety of the supporting structure 16.

Referring to FIG. 22, in some embodiments, the operations as depicted in FIGS. 13 to 17 and 19 are performed on the intermediate structure of FIG. 21. A semiconductor structure as shown in FIG. 22 is thereby formed. In some embodiments, the second conductive layer 15 is electrically isolated from the first conductive layer 12 by the first layer 13. In some embodiments, the first layer 13 covers at least a portion of the supporting structure 16. In some embodiments, the second conductive layer 15 covers at least a portion of the supporting structure 16. In some embodiments, an entirety of the supporting structure 16 is considered as the fixed member 311, and the first conductive layer 12 and the second conductive layer 15 together are considered as the floating member 312. Similar to the description above, in other embodiments, the formation of the second conductive layer 15 is omitted, and a semiconductor structure similar to that shown in FIG. 22 but without the second conductive layer 15 is provided.

Figures 23A, 23B, 23C, 23D, 23E:
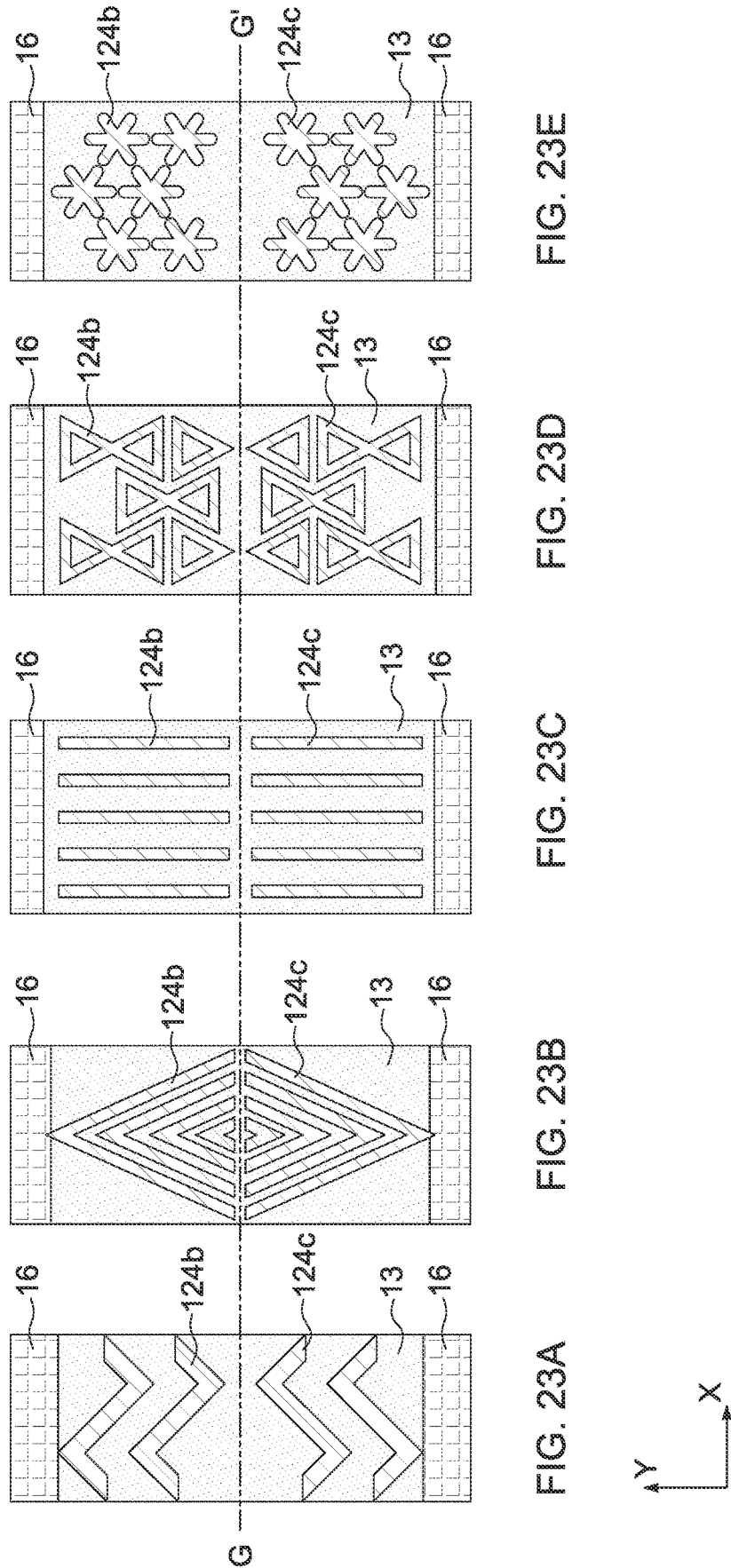
FIGS. 23A to 23E are schematic top-view perspectives of the structure of FIG. 19 in accordance with some embodiments of the disclosure.

Referring to FIGS. 23A to 23E, a pattern of the concave portions 124b and 124c (i.e., a pattern of the recesses 43 and 44) from a top view perspective can be different according to different applications. In some embodiments, configurations of the concave portions 124b and 124c of the first conductive layer 12 from a top view perspective may be line symmetry. In some embodiments, configurations of the concave portions 124b and 124c of the first conductive layer 12 from a top view perspective form multiple Z shapes symmetrical with respect to a line G-G' as shown in FIG. 23A. In some embodiments, configurations of the concave portions 124*b* and 124*c* from the top view perspective include multiple concentric chevrons symmetrical with respect to the line G-G' as shown in FIG. 23B. In some embodiments, the concave portions 124*b* and 124*c* from the top view perspective include multiple straight lines along a length of the floating member 312 and symmetrical with respect to the line G-G' as shown in FIG. 23C. In some embodiments, the concave portions 124*b* and 124*c* from the top view perspective include multiple bowtie shapes symmetrical with respect to the line G-G' as shown in FIG. 23D. In some embodiments, the concave portions 124*b* and 124*c* from the top view perspective include multiple asterisks symmetrical with respect to the line G-G' as shown in FIG. 23E.

In the above embodiments, the first layer 13 is sandwiched between the first conductive layer 12 and the second conductive layer 15 or the second layer 14. In other embodiments, the first layer 13 is alternately arranged with the second conductive layer 15 or the second layer 14.

Referring to FIG. 24, in some embodiments, a patterning operation is performed on the intermediate structure shown in FIG. 20 to form a plurality of trenches 45. In some embodiments, an etching operation is performed to form the trench 45. A depth 455 and a width 456 of each of the trenches 45 can be adjusted according to different applications. In some embodiments, the depth 455 or the width 456 is in a range of 5 Å to 100 μm. In some embodiments, a trench pattern density of the first conductive layer 12 is in a range of 5% to 90% for a purpose of structural integrity, wherein the trench pattern density is a ratio of an overall volume of the trenches 45 to a volume of the first conductive layer 12 in an area. In some embodiments, a plurality of protruding portions 121 of the first conductive layer 12 are defined between the trenches 45.

Referring to FIG. 25, a first layer 13 is formed over the first conductive layer 12. In some embodiments, the first layer 13 fills the trenches 45 and covers all the protruding portions 121 of the first conductive layer 12. In some embodiments, a planarization is performed after deposition of the first layer 13.

Referring to FIG. 26, portions of the first layer 13 are removed to expose some of the protruding portions 121 of the first conductive layer 12. In some embodiments, the exposed protruding portions 121 and the protruding portions 121 covered by the first layer 13 are alternately arranged. In some embodiments, the supporting structure 16 are exposed through the first layer 13.

Referring to FIG. 27, a second layer 14 or a conductive layer 15 is formed over the first conductive layer 12. In some embodiments, the second layer 14 is formed for a purpose of stress absorption. In some embodiments, the conductive layer 15 is formed for a purpose of enhancement of capacitance detection. For ease of description, the second layer 14 or the conductive layer 15 is referred to as a layer 14/15. In some embodiments, the layer 14/15 is deposited over the first conductive layer 12 and the first layer 13. In some embodiments, the layer 14/15 fills spaces between the first layer 13 and adjacent protruding portions 121. In some embodiments, the layer 14/15 covers each of the exposed protruding portions 121. In some embodiments, the layer 14/15 further covers the supporting structure 16. In some embodiments, a planarization is performed on the layer 14/15 until an exposure of the first layer 13 occurs as shown in FIG. 27. In alternative embodiments, the planarization is performed on the layer 14/15 until an exposure of the first conductive layer 12 occurs as shown in FIG. 28.

Referring to FIG. 29, the sacrificial layer 19 is removed. The removal of the sacrificial layer 19 is performed on the intermediate structure of FIG. 27 to form a semiconductor structure as shown in FIG. 29 as an exemplary embodiment for a purpose of illustration. In some embodiments, the first layer 13 and the layer 14/15 together become a buffering structure. In some embodiments, an annealing operation is optionally performed when the first layer 13 is made of silicon nitride.

Referring to FIGS. 30A and 30B, FIG. 30A is a top view of the semiconductor structure shown in FIG. 29, and FIG. 30A is a top view of a semiconductor structure when the intermediate structure shown in FIG. 28 is applied. As described above, the supporting structure 16 can be on one end of the floating member 312, can be two opposite ends of the floating member 312, or can surround the floating member 312. In some embodiments, portions of the supporting structure 16 connected to (or contacting with) the substrate 11 are considered as the fixed member 311, and rest portions of the supporting structure 16 and the first conductive layer 12 are considered as the floating member 312. In some embodiments, as shown in FIGS. 30A and 30B, the supporting structure 16 surrounds or encircles a slot 312*a* of the floating member 312. In some embodiments, the first layer 13 and the layer 14/15 are alternately arranged along a length direction (e.g., the direction Y) of the slot 312*a* of the floating member 312 as shown in FIGS. 30A and 30B. In some embodiments, the first layer 13, the layer 14/15 and the protruding portions 121 are alternately arranged along the length direction of the slot 312*a* of the floating member 312 as shown in FIG. 30B.

Referring to FIGS. 31A and 31B, FIG. 31A is a schematic cross-sectional diagram along a line H-H' in FIG. 30A, and FIG. 31B is a schematic cross-sectional diagram along a line I-I' in FIG. 30A. In some embodiments, an entirety of the supporting structure 16 surrounding the slot 312*a* is connected to the substrate 11 as shown in FIGS. 31A and 31B. In some embodiments, the first layer 13 covers two opposite lateral portions of the supporting structure 16.

FIGS. 30A and 30B show the protruding portions 121 forming multiple straight lines. However, the invention is not limited thereto. Referring to FIGS. 32A to 32D, top views of the semiconductor structure shown in FIG. 29 according to different embodiments are provided. In some embodiments, a configuration of the protruding portions 121 includes a series of parallel, diagonal straight lines as shown in FIG. 32A. In some embodiments, a configuration of the protruding portions 121 includes a series of parallel, undulating waves arranged along the Y direction, wherein each of the waves extends in the X direction as shown in FIG. 32B. In some embodiments, a configuration of the protruding portions 121 includes a series of parallel, undulating waves arranged along the X direction, wherein each of the waves extends along the Y direction as shown in FIG. 32C. In some embodiments, a configuration of the protruding portions 121 includes a series of parallel zig-zag lines arranged along the Y direction, wherein each of the zig-zag lines extends generally in the X direction as shown in FIG. 32D. An extending direction of the protruding portions 121 defines an extending direction of the first layer 13 and the layer 14/15, which can determine ability to absorb forces from various directions. For example, the pattern of the protruding portions 121 as shown in FIG. 30A is designed to absorb the forces from the X direction. The patterns of the protruding portions 121 shown in FIGS. 32A to 32D can absorb the forces from both the X direction and the Y direction.

In accordance with some embodiments of the disclosure, a semiconductor structure is provided. The semiconductor structure includes a substrate; a fixed structure, disposed on the substrate; a floating structure, connected to the fixed structure and separate from the substrate, wherein a first surface of the floating structure facing the substrate includes a plurality of recesses; and a capping layer, disposed on the first surface of the floating structure, wherein the capping layer exposes a portion of the floating structure.

In accordance with some embodiments of the disclosure, a semiconductor structure is provided. The semiconductor structure includes a substrate; a fixed structure, disposed on the substrate; a floating structure, connected to the fixed structure and separate from the substrate and including a plurality of protruding portions extending away from the substrate; and a buffering structure, disposed on the floating structure and between the protruding portions, wherein the buffering structure includes a first layer and a second layer alternately arranged along an extending direction of the floating structure.

In accordance with some embodiments of the disclosure, a semiconductor structure is provided. The semiconductor structure includes a substrate; a fixed structure, disposed on the substrate; a first conductive layer, connected to the fixed structure and separate from the substrate, wherein a top surface of the first conductive layer includes a planar portion and a first concave portion, and the first concave portion includes a first tilted surface, tilted with respect to a bottom surface of the first conductive layer; and a capping layer, disposed on the top surface of the first conductive layer.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a fixed structure, disposed on the substrate;
a floating structure, connected to the fixed structure and separated from the substrate, wherein a first surface of the floating structure facing the substrate includes a plurality of recesses from a cross-sectional view; and
a capping layer, disposed on the first surface of the floating structure, wherein the capping layer covers a bottom and sidewalls of at least one of the recesses and exposes a portion of the first surface of the floating structure outside the recesses.

2. The semiconductor structure of claim 1, wherein the floating structure includes a metallic material.

3. The semiconductor structure of claim 1, wherein the capping layer lines at least a portion of the plurality of recesses.

4. The semiconductor structure of claim 1, wherein the capping layer includes silicon nitride.

5. The semiconductor structure of claim 1, wherein the first surface includes a planar portion and a concave portion indented into the planar portion, and the capping layer exposes at least a portion of the planar portion of the first surface.

6. The semiconductor structure of claim 1, wherein the first surface includes a planar portion and a concave portion indented into the planar portion, and the capping layer exposes at least a portion of the concave portion of the first surface.

7. A semiconductor structure, comprising:
a substrate;
a fixed structure, disposed on the substrate;
a floating structure, connected to the fixed structure and separated from the substrate and including a first protruding portion and a second protruding portion extending away from the substrate;
a first buffering structure covering sidewalls of the first protruding portion of the floating structure; and
a second buffering structure covering sidewalls of the second protruding portion of the floating structure, wherein the first buffering structure and the second buffering structure comprise different materials,
wherein a topmost surface of the first buffering structure is aligned with a topmost surface of the second buffering structure.

8. The semiconductor structure of claim 7, wherein a top surface of the first protruding portion of the floating structure is exposed through the first buffering structure, and a top surface of the second protruding portion of the floating structure is exposed through by the second buffering structure.

9. The semiconductor structure of claim 7, wherein a top surface of the first protruding portion of the floating structure is covered by the first buffering structure, and a top surface of the second protruding portion of the floating structure is covered by the second buffering structure.

10. The semiconductor structure of claim 8, wherein the first buffering structure is in contact with the second buffering structure.

11. The semiconductor structure of claim 7, wherein the first buffering structure includes polysilicon, silicon oxide ($SiO_2$), phosphosilicate glass (PSG), fluorosilicate glass (FSG), silicon nitride (SiN), silicon oxynitride (SiON), silicon carbide (SiC), extra low-k materials (ELK), low-k materials (LK), hard black diamond (HBD), polysilicon, amorphous silicon, or a combination thereof.

12. The semiconductor structure of claim 7, wherein the floating structure and the second buffering structure include different conductive materials, and the floating structure or the second layer includes titanium (Ti), tantalum (Ta), aluminum (Al), copper (Cu), tungsten (W), an alloy thereof, or a combination thereof.

13. The semiconductor structure of claim 7, wherein the second buffering structure covers the fixed structure.

14. A semiconductor structure, comprising:
a substrate;
a fixed structure, wherein the fixed structure comprises a bottom disposed on the substrate;
a first conductive layer, connected to the fixed structure and separated from the substrate, wherein a top surface of the first conductive layer includes a planar portion and a first concave portion, and the first concave portion includes a first tilted surface tilted with respect to a bottom surface of the first conductive layer;
a second conductive layer, connected to the fixed structure and over the first conductive layer; and a capping layer, disposed between the first conductive layer and the second conductive layer, and in contact with the top surface of the first conductive layer, wherein the first conductive layer, the second conductive layer and the capping layer are coupled to a sidewall of the fixed structure.

15. The semiconductor structure of claim 14, wherein the top surface of the first conductive layer further includes a second concave portion having a second tilted surface tilted with respect to the bottom surface of the first conductive layer, wherein a first angle between the first tilted surface and the bottom surface is different from a second angle between the second tilted surface and the bottom surface.

16. The semiconductor structure of claim 15, wherein the first concave portion and the second concave portion are symmetrically arranged.

17. The semiconductor structure of claim 14, wherein the second conductive layer comprises a plurality of protruding portions extending toward the first conductive layer at the first concave portion.

18. The semiconductor structure of claim 17, wherein each of the protruding portions has a surface substantially parallel to the first tilted surface.

19. The semiconductor structure of claim 14, wherein the capping layer includes silicon nitride.

20. The semiconductor structure of claim 14, wherein the second conductive layer is separated from the first conductive layer.

\* \* \* \* \*